United States Patent
Matsuda et al.

(10) Patent No.: US 8,519,422 B2
(45) Date of Patent: Aug. 27, 2013

(54) ENCAPSULATING SHEET AND OPTICAL SEMICONDUCTOR ELEMENT DEVICE

(75) Inventors: Hirokazu Matsuda, Osaka (JP); Takashi Kondo, Osaka (JP); Hiroki Kono, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/491,051

(22) Filed: Jun. 7, 2012

(65) Prior Publication Data
US 2012/0319153 A1    Dec. 20, 2012

(30) Foreign Application Priority Data

Jun. 14, 2011 (JP) ................. 2011-132275
Oct. 18, 2011 (JP) ................. 2011-228921

(51) Int. Cl.
*H01L 33/00* (2010.01)

(52) U.S. Cl.
USPC ............ 257/98; 257/100; 257/433; 257/435; 257/E33.061; 428/339

(58) Field of Classification Search
USPC .............. 257/98, 100, 433, 435, E33.061; 428/339
See application file for complete search history.

(56) References Cited

U.S. PATENT DOCUMENTS
7,312,104 B2 * 12/2007 Noro ........................ 438/108

FOREIGN PATENT DOCUMENTS
JP       2001-358368 A    12/2001

* cited by examiner

*Primary Examiner* — Tu-Tu Ho
(74) *Attorney, Agent, or Firm* — Sughrue Mion, PLLC

(57) ABSTRACT

An encapsulating sheet includes an encapsulating resin layer and a wavelength conversion layer laminated on the encapsulating resin layer. The wavelength conversion layer is formed by laminating a barrier layer formed of a light transmissive resin composition and having a thickness of 200 μm to 1000 μm, and a phosphor layer containing a phosphor.

6 Claims, 5 Drawing Sheets

(a)

(b)

(c)

(d)

(a)

(b)

ENCAPSULATING SHEET AND OPTICAL SEMICONDUCTOR ELEMENT DEVICE

CROSS-REFERENCE TO RELATED APPLICATION

The present application claims priority from Japanese Patent Applications No. 2011-132275 filed on Jun. 14, 2011 and No. 2011-228921 filed on Oct. 18, 2011, the contents of which are hereby incorporated by reference into this application.

BACKGROUND OF THE INVENTION

1. Field of the Invention

The present invention relates to an encapsulating sheet and an optical semiconductor element device, to be specific, to an optical semiconductor element device used for an optical application and an encapsulating sheet used therein.

2. Description of Related Art

Conventionally, as a light emitting device that is capable of emitting high-energy light, a white light emitting device has been known.

In the white light emitting device, for example, blue light is emitted by an optical semiconductor and a part of the emitted blue light is converted into yellow light by a phosphor layer containing a phosphor, so that white light is emitted by color mixing of the blue light and the yellow light.

In recent years, in the white light emitting device, in order to improve extraction efficiency of the light from the optical semiconductor and reduce angle dependence of color tone, a configuration of separating the phosphor layer from the optical semiconductor has been considered.

As the white light emitting device, for example, a semiconductor light emitting device including an LED, a phosphor cover housing the LED in the internal space thereof, and a resin encapsulating material filling in the space between the LED and the phosphor cover has been proposed (ref: for example, Japanese Unexamined Patent Publication No. 2001-358368).

SUMMARY OF THE INVENTION

However, in the semiconductor light emitting device described in Japanese Unexamined Patent Publication No. 2001-358368, there may be a case where the temperature of the resin encapsulating material is increased by heat generation of the LED and the phosphor cover along with the light emission, so that a bleeding of a residual monomer (an unreacted liquid resin) in the resin encapsulating material occurs. In this way, there is a disadvantage of damaging the appearance of the semiconductor light emitting device.

It is an object of the present invention to provide an encapsulating sheet that is capable of suppressing a bleeding in an encapsulating resin layer and improving the appearance of an optical semiconductor element device, and the optical semiconductor element device that is encapsulated by the encapsulating sheet.

An encapsulating sheet of the present invention includes an encapsulating resin layer and a wavelength conversion layer laminated on the encapsulating resin layer, wherein the wavelength conversion layer is formed by laminating a barrier layer formed of a light transmissive resin composition and having a thickness of 200 μm to 1000 μm, and a phosphor layer containing a phosphor.

In the present invention, it is preferable that the light transmissive resin composition contains a silicone resin.

In the present invention, it is preferable that the elastic modulus of the barrier layer is 3 MPa to 500 MPa.

In the present invention, the barrier layer may be laminated on the encapsulating resin layer or the phosphor layer may be laminated on the encapsulating resin layer.

An optical semiconductor element device of the present invention includes an optical semiconductor element and an encapsulating layer that is formed of the above-described encapsulating sheet and encapsulates the optical semiconductor element.

In the encapsulating sheet of the present invention, the wavelength conversion layer in which the barrier layer and the phosphor layer are laminated is laminated on the encapsulating resin layer.

Therefore, in the optical semiconductor element device in which the optical semiconductor element is encapsulated by the encapsulating sheet of the present invention, even when the optical semiconductor element and the phosphor layer generate heat along with the light emission, the bleeding of the residual monomer (the unreacted liquid resin) in the encapsulating resin layer can be suppressed by the barrier layer. As a result, it is possible to improve the appearance of the optical semiconductor element device.

Accordingly, the encapsulating sheet of the present invention can suppress the bleeding of the residual monomer (the unreacted liquid resin) in the encapsulating resin layer and improve the appearance of the optical semiconductor element device.

(a) illustrating a step of preparing a release sheet,
(b) illustrating a step of forming a phosphor layer,
(c) illustrating a step of laminating a barrier layer, and
(d) illustrating a step of laminating an encapsulating resin layer.

Figure 3:
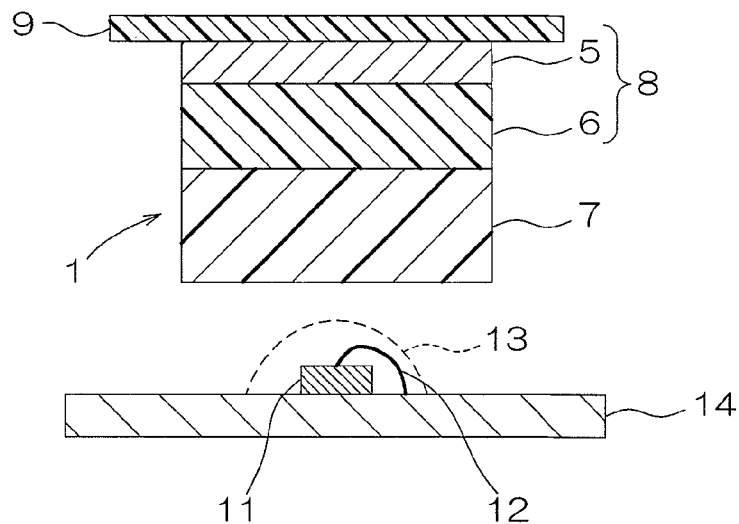
Figure 3:
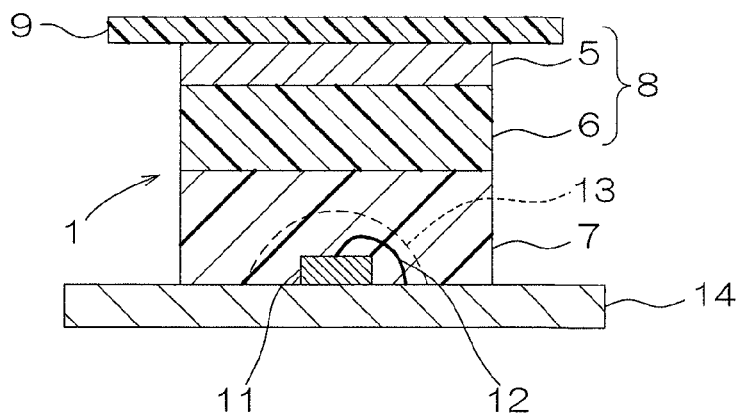
Figure 3:
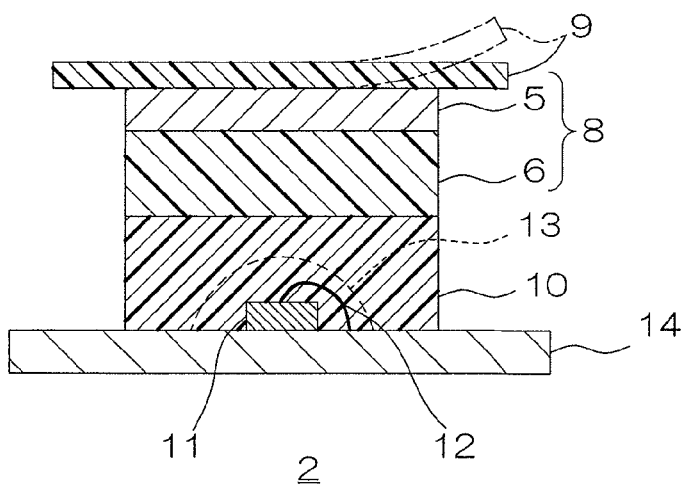

FIG. 3 shows process drawings for illustrating the steps for fabricating an optical semiconductor element device by encapsulating an optical semiconductor element by one embodiment of the encapsulating sheet of the present invention:

(a) illustrating a step of preparing the encapsulating sheet and the optical semiconductor element,
(b) illustrating a step of attaching the encapsulating sheet onto a board to encapsulate the optical semiconductor element, and
(c) illustrating a step of heating the encapsulating sheet to be cured.

Figure 4:
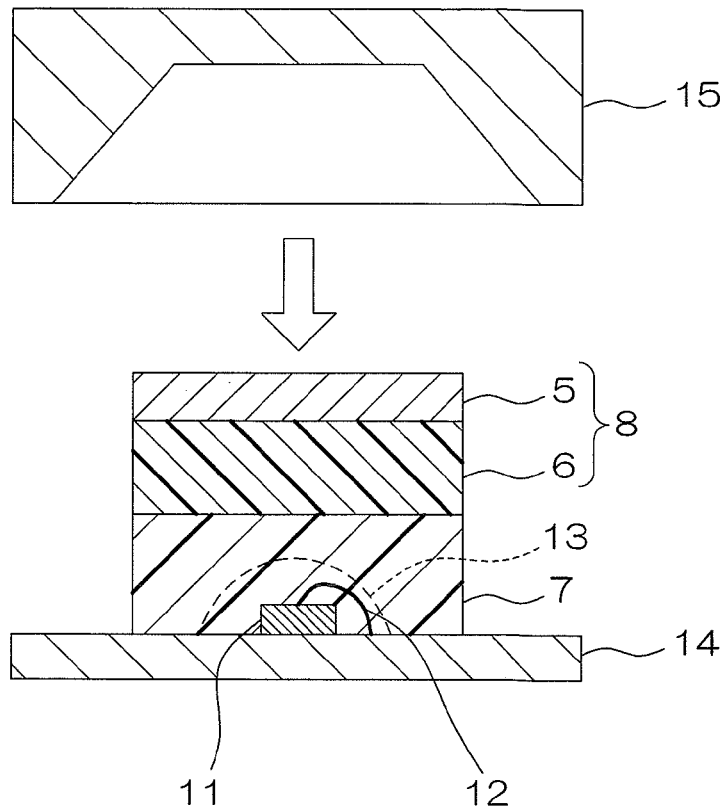
Figure 4:
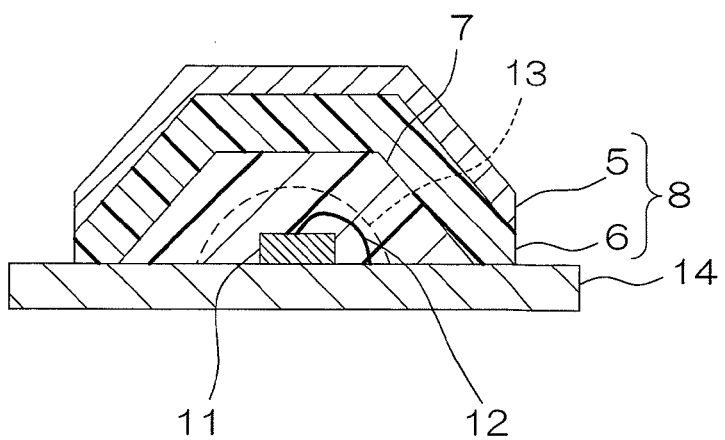

FIG. 4 shows process drawings for illustrating the steps for pressure molding one embodiment of the encapsulating sheet of the present invention with a metal mold die:

(a) illustrating a step of disposing the metal mold die and
(b) illustrating a step of pressure molding the encapsulating sheet with the metal mold die.

Figure 5:
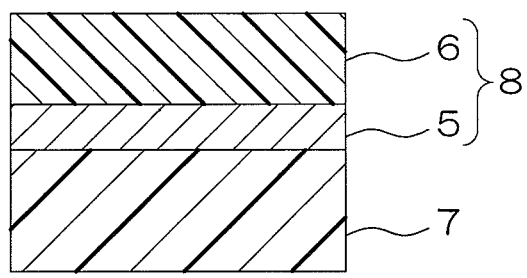

FIG. 5 shows a side sectional view of another embodiment of the encapsulating sheet of the present invention.

DETAILED DESCRIPTION OF THE INVENTION

Figure 1:
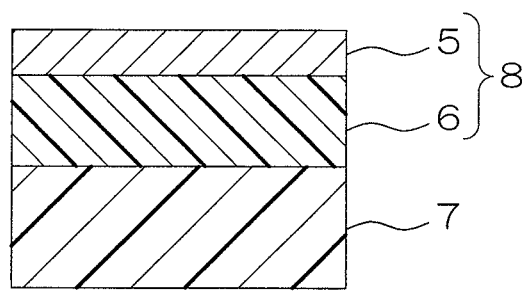
FIG. 1 shows a side sectional view of one embodiment of an encapsulating sheet of the present invention.

As shown in FIG. 1, an encapsulating sheet 1 includes an encapsulating resin layer 7 and a wavelength conversion layer 8 laminated thereon.

The encapsulating resin layer 7 is formed of an encapsulating resin composition and is formed into a generally sheet state.

The encapsulating resin composition contains a known transparent resin used in encapsulating an optical semiconductor element. Examples of the transparent resin include a thermosetting resin such as a silicone resin, an epoxy resin, and a urethane resin and a thermoplastic resin such as an acrylic resin, a styrene resin, a polycarbonate resin, and a polyolefin resin.

The transparent resins can be used alone or in combination.

Of the transparent resins, preferably, a thermosetting resin is used, or more preferably, in view of durability, heat resistance, and light resistance, a silicone resin is used.

Of the encapsulating resin compositions, preferably a resin composition containing a silicone resin (hereinafter, defined as a silicone resin composition) is used.

Examples of the silicone resin composition include a condensation/addition reaction curable type silicone resin composition, a modified silicone resin composition containing a hetero atom, an addition reaction curable type silicone resin composition, and a silicone resin composition containing an inorganic oxide.

Of the silicone resin compositions, preferably, in view of flexibility of the encapsulating resin layer 7 before curing and strength thereof after curing, a condensation/addition reaction curable type silicone resin composition and a modified silicone resin composition containing a hetero atom are used.

The condensation/addition reaction curable type silicone resin composition is a silicone resin composition that can undergo a condensation reaction and an addition reaction (to be specific, a hydrosilylation reaction). To be more specific, the condensation/addition reaction curable type silicone resin composition is a silicone resin composition that can be brought into a semi-cured state by undergoing the condensation reaction by heating and then, be brought into a cured (completely cured) state by undergoing the addition reaction by further heating.

An example of the condensation reaction includes a silanol condensation reaction. Examples of the addition reaction include an epoxy ring-opening reaction and the hydrosilylation reaction.

The condensation/addition reaction curable type silicone resin composition contains, for example, a polysiloxane containing silanol groups at both ends, a silicon compound containing an ethylenically unsaturated hydrocarbon group (hereinafter, defined as an ethylenic silicon compound), a silicon compound containing an epoxy group, an organohydrogensiloxane, a condensation catalyst, and an addition catalyst.

The polysiloxane containing silanol groups at both ends, the ethylenic silicon compound, and the silicon compound containing an epoxy group are condensation materials (materials subjected to the condensation reaction). The ethylenic silicon compound and the organohydrogensiloxane are addition materials (materials subjected to the addition reaction).

The polysiloxane containing silanol groups at both ends is an organosiloxane which contains silanol groups (SiOH groups) at both ends of a molecule and to be specific, is represented by formula (1) below.

Formula (1):

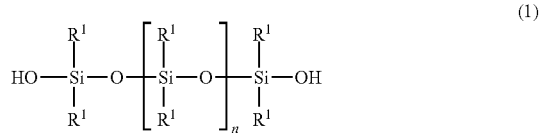

(where, in formula (1), $R^1$ represents a monovalent hydrocarbon group selected from a saturated hydrocarbon group and an aromatic hydrocarbon group. "n" represents an integer of 1 or more.)

In the above-described formula (1), in the monovalent hydrocarbon group represented by $R^1$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described formula (1), in the monovalent hydrocarbon group represented by $R^1$, an example of the aromatic hydrocarbon group includes an aryl group having 6 to 10 carbon atoms (such as a phenyl group and a naphthyl group).

In the above-described formula (1), $R^1$ may be the same or different from each other. Preferably, $R^1$ is the same.

As the monovalent hydrocarbon group, preferably, an alkyl group having 1 to 6 carbon atoms and an aryl group having 6 to 10 carbon atoms are used, or more preferably, in view of transparency, thermal stability, and light resistance, a methyl group is used.

In the above-described formula (1), "n" is preferably, in view of stability and/or handling ability, an integer of 1 to 10000, or more preferably an integer of 1 to 1000.

"n" in the above-described formula (1) is calculated as an average value.

To be specific, examples of the polysiloxane containing silanol groups at both ends include polydimethylsiloxane containing silanol groups at both ends, polymethylphenylsiloxane containing silanol groups at both ends, and polydiphenylsiloxane containing silanol groups at both ends.

The polysiloxanes containing silanol groups at both ends can be used alone or in combination.

Of the polysiloxanes containing silanol groups at both ends, preferably polydimethylsiloxane containing silanol groups at both ends is used.

A commercially available product can be used as the polysiloxane containing silanol groups at both ends. A polysiloxane containing silanol groups at both ends synthesized in accordance with a known method can also be used.

The number average molecular weight of the polysiloxane containing silanol groups at both ends is, for example, in view of stability and/or handling ability, 100 to 1000000, or preferably 200 to 100000. The number average molecular weight is calculated by conversion based on standard polystyrene with a gel permeation chromatography. The number average molecular weight of a material, other than the polysiloxane containing silanol groups at both ends, to be described later, is also calculated in the same manner as the description above.

The silanol group equivalent in the polysiloxane containing silanol groups at both ends is, for example, 0.002 to 25 mmol/g, or preferably 0.02 to 25 mmol/g.

The mixing ratio of the polysiloxane containing silanol groups at both ends is, for example, 1 to 99.99 parts by mass, preferably 50 to 99.9 parts by mass, or more preferably 80 to 99.5 parts by mass with respect to 100 parts by mass of the condensation material.

The ethylenic silicon compound is a silane compound having both an ethylenically unsaturated hydrocarbon group and a leaving group in the silanol condensation reaction and to be specific, is represented by formula (2) below.

Formula (2):

(where, in formula (2), $R^2$ represents a monovalent ethylenically unsaturated hydrocarbon group. $X^1$ represents a halogen atom, an alkoxy group, a phenoxy group, or an acetoxy group. $X^1$ may be the same or different from each other.)

In the above-described formula (2), examples of the ethylenically unsaturated hydrocarbon group represented by $R^2$ include a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, an allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

As the ethylenically unsaturated hydrocarbon group, in view of reactivity with a hydrosilyl group, preferably, an alkenyl group is used, more preferably, an alkenyl group having 2 to 5 carbon atoms is used, or particularly preferably, a vinyl group is used.

$X^1$ in the above-described formula (2) is a leaving group in the silanol condensation reaction. $SiX^1$ group in the above-described formula (2) is a reactive functional group in the silanol condensation reaction.

In the above-described formula (2), examples of the halogen atom represented by $X^1$ include bromine, chlorine, fluorine, and iodine.

In the above-described formula (2), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described formula (2), $X^1$ may be the same or different from each other. Preferably, $X^1$ is the same.

Of the $X^1$s in the above-described formula (2), preferably, an alkoxy group is used, or more preferably, a methoxy group is used.

Examples of the ethylenic silicon compound include trialkoxysilane containing an ethylenically unsaturated hydrocarbon group, trihalogenated silane containing an ethylenically unsaturated hydrocarbon group, triphenoxysilane containing an ethylenically unsaturated hydrocarbon group, and triacetoxysilane containing an ethylenically unsaturated hydrocarbon group.

The ethylenic silicon compounds can be used alone or in combination.

Of the ethylenic silicon compounds, preferably trialkoxysilane containing an ethylenically unsaturated hydrocarbon group is used.

To be specific, examples of the trialkoxysilane containing an ethylenically unsaturated hydrocarbon group include vinyltrialkoxysilane such as vinyltrimethoxysilane, vinyltriethoxysilane, and vinyltripropoxysilane; allyltrimethoxysilane; propenyltrimethoxysilane; butenyltrimethoxysilane; and cyclohexenyltrimethoxysilane.

Of the trialkoxysilanes containing an ethylenically unsaturated hydrocarbon group, preferably, vinyltrialkoxysilane is used, or more preferably, vinyltrimethoxysilane is used.

The mixing ratio of the ethylenic silicon compound is, for example, 0.01 to 90 parts by mass, preferably 0.01 to 50 parts by mass, or more preferably 0.01 to 10 parts by mass with respect to 100 parts by mass of the condensation material.

A commercially available product can be used as the ethylenic silicon compound. An ethylenic silicon compound synthesized in accordance with a known method can also be used.

The silicon compound containing an epoxy group is a silane compound having both an epoxy group and a leaving group in the silanol condensation reaction and to be specific, is represented by formula (3) below.

Formula (3):

(where, in formula (3), $R^3$ represents a group having an epoxy structure. $X^2$ represents a halogen atom, an alkoxy group, a phenoxy group, or an acetoxy group. $X^2$ may be the same or different from each other.)

In the above-described formula (3), examples of the group having an epoxy structure represented by $R^3$ include an epoxy group, a glycidyl ether group, and an epoxycycloalkyl group such as an epoxycyclohexyl group.

Of the groups having an epoxy structure, preferably a glycidyl ether group is used. To be specific, the glycidyl ether group is a glycidoxyalkyl group represented by formula (4) below.

Formula (4):

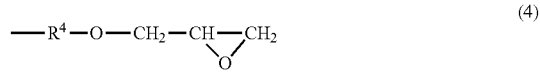

(where, in formula (4), $R^4$ represents a divalent hydrocarbon group selected from a saturated hydrocarbon group and an aromatic hydrocarbon group.)

In the above-described formula (4), in the divalent hydrocarbon group represented by $R^4$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described formula (4), in the divalent hydrocarbon group represented by $R^4$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably a glycidoxypropyl group is used.

$X^2$ in the above-described formula (3) is a leaving group in the silanol condensation reaction. $SiX^2$ group in the above-described formula (3) is a reactive functional group in the silanol condensation reaction.

In the above-described formula (3), an example of the halogen atom represented by $X^2$ includes the same halogen atom as that represented by $X^1$ in the above-described formula (2).

In the above-described formula (3), an example of the alkoxy group represented by $X^2$ includes the same alkoxy group as that represented by $X^1$ in the above-described formula (2).

In the above-described formula (3), $X^2$ may be the same or different from each other. Preferably, $X^2$ is the same.

As $X^2$ in the above-described formula (3), preferably, an alkoxy group is used, or more preferably, a methoxy group is used.

Examples of the silicon compound containing an epoxy group include trialkoxysilane containing an epoxy group, trihalogenated silane containing an epoxy group, triphenoxysilane containing an epoxy group, and triacetoxysilane containing an epoxy group.

The silicon compounds containing an epoxy group can be used alone or in combination.

Of the ethylenic silicon compounds, preferably trialkoxysilane containing an epoxy group is used.

To be specific, examples of the trialkoxysilane containing an epoxy group include glycidoxyalkyltrimethoxysilane such as glycidoxymethyltrimethoxysilane, (2-glycidoxyethyl)trimethoxysilane, and (3-glycidoxypropyl)trimethoxysilane; (3-glycidoxypropyl)triethoxysilane; (3-glycidoxypropyl)tripropoxysilane; and (3-glycidoxypropyl)triisopropoxysilane.

Of the trialkoxysilanes containing an epoxy group, preferably, glycidoxymethyltrialkoxysilane is used, or more preferably, (3-glycidoxypropyl)trimethoxysilane is used.

The mixing ratio of the silicon compound containing an epoxy group is, for example, 0.01 to 90 parts by mass, preferably 0.01 to 50 parts by mass, or more preferably 0.01 to 1 parts by mass with respect to 100 parts by mass of the condensation material.

A commercially available product can be used as the silicon compound containing an epoxy group. A silicon compound containing an epoxy group synthesized in accordance with a known method can also be used.

The molar ratio ($SiOH/(SiX^1+SiX^2)$) of the silanol group (the SiOH group) in the polysiloxane containing silanol groups at both ends to the reactive functional group (the $SiX^1$ group and the $SiX^2$ group) in the ethylenic silicon compound and the silicon compound containing an epoxy group is, for example, 20/1 to 0.2/1, preferably 10/1 to 0.5/1, or more preferably substantially 1/1.

When the molar ratio exceeds the above-described range, there may be a case where a product in a semi-cured state (a semi-cured product) having an appropriate toughness is not obtained when the condensation/addition reaction curable type silicone resin composition is brought into a semi-cured state. On the other hand, when the molar ratio is below the above-described range, the mixing ratio of the ethylenic silicon compound and the silicon compound containing an epoxy group is excessively large, so that the heat resistance of the obtained encapsulating resin layer 7 may be reduced.

When the molar ratio is within the above-described range (preferably, substantially 1/1), the silanol group (the SiOH group) in the polysiloxane containing silanol groups at both ends, and the reactive functional group (the $SiX^1$ group) in the ethylenic silicon compound and the reactive functional group (the $SiX^2$ group) in the silicon compound containing an epoxy group can be subjected to the condensation reaction neither too much nor too little.

The molar ratio of the ethylenic silicon compound to the silicon compound containing an epoxy group is, for example, 10/90 to 99/1, preferably 50/50 to 97/3, or more preferably 80/20 to 95/5.

When the molar ratio is within the above-described range, there is an advantage that the adhesiveness of a cured product can be improved, while the strength thereof is ensured.

The organohydrogensiloxane is an organosiloxane having, in one molecule, at least two hydrosilyl groups without containing an ethylenically unsaturated hydrocarbon group.

To be specific, an example of the organohydrogensiloxane includes an organopolysiloxane containing hydrogen atoms in its side chain and an organopolysiloxane containing hydrogen atoms at both ends.

The organopolysiloxane containing hydrogen atoms in its side chain is an organohydrogensiloxane having hydrogen atoms as a side chain that branches off from the main chain. Examples thereof include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane.

The number average molecular weight of the organopolysiloxane containing hydrogen atoms in its side chain is, for example, 100 to 1000000.

The organopolysiloxane containing hydrogen atoms at both ends is an organohydrogensiloxane having hydrogen atoms at both ends of the main chain. Examples thereof include polydimethylsiloxane containing hydrosilyl groups at both ends, polymethylphenylsiloxane containing hydrosilyl groups at both ends, and polydiphenylsiloxane containing hydrosilyl groups at both ends.

The number average molecular weight of the organopolysiloxane containing hydrogen atoms at both ends is, for example, in view of stability and/or handling ability, 100 to 1000000, or preferably 100 to 100000.

The organohydrogensiloxanes can be used alone or in combination.

Of the organohydrogensiloxanes, preferably, an organopolysiloxane containing hydrogen atoms in its side chain is used, or more preferably, dimethylpolysiloxane-co-methylhydrogenpolysiloxane is used.

The viscosity of the organohydrogensiloxane at 25° C. is, for example, 10 to 100000 mPa·s, or preferably 20 to 50000 mPa·s. The viscosity is measured using a B-type viscometer.

The hydrosilyl group equivalent in the organohydrogensiloxane is, for example, 0.1 to 30 mmol/g, or preferably 1 to 20 mmol/g.

A commercially available product can be used as the organohydrogensiloxane. An organohydrogensiloxane synthesized in accordance with a known method can also be used.

The mixing ratio of the organohydrogensiloxane is, although depending on the molar ratio of the ethylenically unsaturated hydrocarbon group ($R^2$ in the above-described formula (2)) in the ethylenic silicon compound to the hydrosilyl group (the SiH group) in the organohydrogensiloxane, for example, 10 to 10000 parts by mass, or preferably 100 to 1000 parts by mass with respect to 100 parts by mass of the ethylenic silicon compound.

The molar ratio ($R^2/SiH$) of the ethylenically unsaturated hydrocarbon group ($R^2$ in the above-described formula (2)) in the ethylenic silicon compound to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio thereof can also be set to be, for example, less than 1/1 and not less than 0.05/1.

When the molar ratio exceeds 20/1, there may be a case where a semi-cured product having an appropriate toughness is not obtained when the condensation/addition reaction curable type silicone resin composition is brought into a semi-cured state. On the other hand, when the molar ratio is below 0.05/1, the mixing ratio of the organohydrogensiloxane is excessively large, so that the heat resistance and the toughness of the obtained encapsulating resin layer 7 may be insufficient.

When the molar ratio is less than 1/1 and not less than 0.05/1, in allowing the condensation/addition reaction curable type silicone resin composition to be in a semi-cured state, the condensation/addition reaction curable type silicone resin composition can be quickly transferred into a semi-cured state, compared with the condensation/addition reaction curable type silicone resin composition whose molar ratio is 20/1 to 1/1.

The condensation catalyst is not particularly limited as long as it is a substance capable of improving the reaction speed of the condensation reaction of the silanol group and the reactive functional group (the $SiX^1$ group in the above-described formula (2) and the $SiX^2$ group in the above-described formula (3)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

The condensation catalysts can be used alone or in combination.

Of the condensation catalysts, in view of compatibility and thermal decomposition characteristics, preferably, a base is used, or more preferably, tetramethylammonium hydroxide is used.

The mixing ratio of the condensation catalyst is, for example, 0.1 to 50 moles, or preferably 0.5 to 5 moles with respect to 100 moles of the polysiloxane containing silanol groups at both ends.

The addition catalyst is not particularly limited as long as it is a substance (a hydrosilylation catalyst) capable of improving the reaction speed of the addition reaction, that is, the hydrosilylation reaction of the ethylenically unsaturated hydrocarbon group and the SiH. Examples of the addition catalyst include a metal catalyst such as a platinum catalyst such as platinum black, platinum chloride, chloroplatinic acid, a platinum olefin complex, a platinum carbonyl complex, and platinum acetyl acetate; a palladium catalyst; and a rhodium catalyst.

The addition catalysts can be used alone or in combination.

Of the addition catalysts, in view of compatibility, transparency, and catalyst activity, preferably, a platinum catalyst is used, or more preferably, a platinum-carbonyl complex is used.

The mixing ratio of the addition catalyst is, as a number of parts by mass of the metal amount in the addition catalyst, with respect to 100 parts by mass of the organohydrogensiloxane, for example, $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass.

As the above-described catalyst, a catalyst in a solid state can be used as it is. Alternatively, in view of handling ability, a catalyst dissolved or dispersed in a solvent can be used as a solution or a dispersion liquid.

Examples of the solvent include water and an alcohol such as methanol and ethanol. Preferably, an alcohol is used.

The above-described polysiloxane containing silanol groups at both ends, ethylenic silicon compound, silicon compound containing an epoxy group, and organohydrogensiloxane are blended with the catalysts (the condensation catalyst and the addition catalyst) to be stirred and mixed, so that the condensation/addition reaction curable type silicone resin composition is prepared.

To prepare the condensation/addition reaction curable type silicone resin composition, for example, the above-described materials (the condensation materials and the addition materials) and the catalysts can be added simultaneously. Alternatively, each of the materials and each of the catalysts can be added, respectively, at different timings. Furthermore, a part of the components can be added simultaneously and each of the remaining components can be added, respectively, at different timings.

Of the preparing methods of the condensation/addition reaction curable type silicone resin composition, preferably, the following method is used. The condensation material and the condensation catalyst are first added simultaneously. Next, the addition material is added thereto and then, the addition catalyst is added thereto.

To be specific, the polysiloxane containing silanol groups at both ends, the ethylenic silicon compound, and the silicon compound containing an epoxy group (that is, the condensation materials) are simultaneously blended with the condensation catalyst at the above-described ratio to be stirred for, for example, 5 minutes to 24 hours.

At the time of blending and stirring, the temperature can also be adjusted to, for example, 0 to 60° C. so as to improve compatibility and handling ability of the condensation materials.

At the time of blending of the materials and the condensation catalyst, a compatibilizing agent for improving the compatibility thereof can be added at an appropriate ratio.

An example of the compatibilizing agent includes an organic solvent such as an alcohol including methanol. When the condensation catalyst is prepared as a solution or a dispersion liquid of the organic solvent, the organic solvent can serve as the compatibilizing agent.

Thereafter, the pressure in the system (the above-described mixture) is reduced as required, so that a volatile component (the organic solvent) is removed.

Next, the organohydrogensiloxane is blended into the obtained mixture of the condensation materials and the condensation catalyst to be stirred for, for example, 1 to 120 minutes.

At the time of blending and stirring, the temperature can also be adjusted to, for example, 0 to 60° C. so as to improve compatibility and handling ability of the mixture and the organohydrogensiloxane.

Thereafter, the addition catalyst is blended into the system (the above-described mixture) to be stirred for, for example, 1 to 60 minutes.

In this way, the condensation/addition reaction curable type silicone resin composition can be prepared.

The prepared condensation/addition reaction curable type silicone resin composition is, for example, in a liquid state (in an oil state). As described later, after the condensation/addition reaction curable type silicone resin composition is applied onto a barrier layer 6, the condensation materials are subjected to a condensation reaction by heating thereof. As described later, after the condensation/addition reaction curable type silicone resin composition encapsulates a light emitting diode 11, the addition material is subjected to an addition reaction by further heating thereof to form the condensation/addition reaction curable type silicone resin.

The modified silicone resin composition containing a hetero atom contains, for example, the polysiloxane containing silanol groups at both ends and a hetero atom complex.

An example of the polysiloxane containing silanol groups at both ends includes the same polysiloxane containing silanol groups at both ends as that represented by the above-described formula (1).

The polysiloxanes containing silanol groups at both ends can be used alone or in combination.

Of the polysiloxanes containing silanol groups at both ends, preferably a polysiloxane containing silanol groups at both ends where in the above-described formula (1), "n" is an integer of 1 to 1000 is used.

The hetero atom complex is a complex of the hetero atom other than Si, O, C, and H. To be specific, the hetero atom complex represented by formula (5) below is used.

Formula (5):

$$M\text{-}(OY)_n \qquad (5)$$

(where, in formula (5), M represents a hetero atom other than Si, O, C, and H. Y represents a hydrogen atom or a monovalent hydrocarbon group selected from a saturated hydrocarbon group and an aromatic hydrocarbon group. "n" represents a valence of the hetero atom. Y may be the same or different from each other.)

In the above-described formula (5), examples of the hetero atom represented by M include a metal atom such as aluminum and titanium; boron; and phosphorus.

Of the hetero atoms, preferably, a metal atom is used, or more preferably, aluminum is used.

In the above-described formula (5), "n" is the same number as the valence of the hetero atom and is, for example, an integer of 1 to 6, or preferably an integer of 3 to 5.

In the above-described formula (5), an example of the monovalent hydrocarbon group represented by Y includes the same monovalent hydrocarbon group as that represented by the above-described formula (1).

Of the monovalent hydrocarbon groups, preferably, a saturated hydrocarbon group is used, more preferably, an alkyl group having 1 to 6 carbon atoms is used, or particularly preferably, an isopropyl group is used.

Examples of the hetero atom complex include aluminum alkoxide, titanium alkoxide, boron alkoxide, and phosphorous alkoxide.

The hetero atom complexes can be used alone or in combination.

Of the hetero atom complexes, preferably aluminum alkoxide is used.

To be specific, examples of the aluminum alkoxide include aluminum trimethoxide, aluminum triethoxide, aluminum tripropoxide, aluminum triisopropoxide, and aluminum tributoxide. Preferably, aluminum triisopropoxide is used.

The mixing ratio of the hetero atom complex is, for example, 0.01 to 20 parts by mass, or preferably 0.1 to 10 parts by mass with respect to 100 parts by mass of the polysiloxane containing silanol groups at both ends.

The polysiloxane containing silanol groups at both ends and the hetero atom complex are blended at the above-described mixing ratio to be stirred and mixed at room temperature, so that the modified silicone resin composition containing a hetero atom is prepared.

The modified silicone resin composition containing a hetero atom (a modified silicone resin composition containing aluminum) can also be prepared in accordance with the descriptions in Japanese Unexamined Patent Publications No. 2009-127021 and No. 2009-235376.

The prepared modified silicone resin composition containing a hetero atom is, for example, in a liquid state (in an oil state). As described later, after the modified silicone resin composition containing a hetero atom is applied onto the barrier layer 6, the light emitting diode 11 is encapsulated by heating thereof. Thereafter, by further heating, the contained polysiloxane containing silanol groups at both ends and hetero atom complex are subjected to the condensation reaction to form a modified silicone resin containing a hetero atom.

The modified silicone resin containing a hetero atom is a silicone resin (a silicone resin containing a Si—O-M bond) in which a Si atom in a siloxane skeleton is bonded to the above-described hetero atom via an oxygen atom. Examples of the modified silicone resin containing a hetero atom include an aluminosiloxane resin (containing a Si—O—Al bond), a titanasiloxane resin (containing a Si—O—Ti bond), a borosiloxane resin (containing a Si—O—B bond), and a phosphorsiloxane resin (containing a Si—O—P bond).

A filler and a silane coupling agent can be added into the encapsulating resin composition as required.

Examples of the filler include silica (silicon dioxide), barium sulfate, barium carbonate, barium titanate, titanium oxide, zirconium oxide, magnesium oxide, zinc oxide, iron oxide, aluminum hydroxide, calcium carbonate, layered mica, carbon black, diatomite, glass fiber, and silicone resin microparticles.

The fillers can be used alone or in combination.

Of the fillers, preferably silica (silicon dioxide) and silicone resin microparticles are used.

The silicone resin microparticles are microparticles of the polysiloxane (after curing) having a cross-linked structure. The refractive index thereof is similar to that of the silicone resin composition (the encapsulating resin layer 7 after curing (an encapsulating layer 10)).

Therefore, a preferable example of the combination of the encapsulating resin composition and the filler includes, when considering transparency of the encapsulating sheet 1, that is, brightness (described later) of an LED device 2 (described later), the combination of the silicone resin composition and the silicone resin microparticles.

When the silicone resin microparticles are added to the silicone resin composition, the hardness of the encapsulating layer 10 can be improved and backscattering in the encapsulating layer 10 can be prevented compared with the case where another filler is added thereto. As a result, a brightness loss of the LED device 2 (described later) can be suppressed and the brightness of the LED device 2 (described later) can be improved.

The brightness loss is a percentage, with respect to an initial brightness (hereinafter, defined as a reference brightness) of a total luminous flux in the LED device 2 (described later) where an encapsulating resin composition without being added with a filler is used, of a value obtained by subtracting an initial brightness (hereinafter, defined as a brightness) of the total luminous flux in the LED device 2 (described later) where an encapsulating resin composition added with a filler is used from the reference brightness.

An example of the silicone resin microparticles includes polysilsesquioxane microparticles. When considering hardness (reinforcing effect of the encapsulating layer 10 with respect to the barrier layer 6), preferably polymethylsilsesquioxane microparticles are used.

The average particle size (the average of the maximum length) of the silicone resin microparticle is, for example, 0.2 to 40 μm, or preferably 0.5 to 10 μm. The average particle size of the silicone resin microparticle is measured with a particle size distribution analyzer.

When the filler is the silica (silicon dioxide), the addition ratio thereof is, for example, 1 to 50 parts by mass, or preferably 5 to 20 parts by mass with respect to 100 parts by mass of the encapsulating resin composition.

When the filler is the silicone resin microparticles, the addition ratio thereof is, for example, 1 to 60 parts by mass, or preferably 10 to 50 parts by mass with respect to 100 parts by mass of the encapsulating resin composition.

Examples of the silane coupling agent include a vinylsilane type silane coupling agent and a methacryl type silane coupling agent.

Of the silane coupling agents, preferably a methacryl type silane coupling agent is used.

The addition ratio of the silane coupling agent is, for example, 1 to 50 parts by mass, or preferably 5 to 20 parts by mass with respect to 100 parts by mass of the encapsulating resin composition.

Furthermore, a known additive can be added to the above-described encapsulating resin composition at an appropriate ratio as required. Examples of the known additive include antioxidants, modifiers, surfactants, dyes, pigments, discoloration inhibitors, and ultraviolet absorbers.

The encapsulating resin composition is subjected to a defoaming process as required after the preparation thereof.

An example of the defoaming method includes a known defoaming method such as reduced pressure defoaming (vacuum defoaming), centrifugal defoaming, and ultrasonic defoaming. Preferably, reduced pressure defoaming (vacuum defoaming) is used.

When the defoaming method is the reduced pressure defoaming (vacuum defoaming), defoaming conditions are as follows: a temperature of, for example, 10 to 40° C., or preferably 15 to 35° C. and a duration of, for example, 10 minutes or more, or preferably 30 minutes or more.

When the encapsulating resin layer 7 is formed of an encapsulating resin composition containing a thermosetting resin (preferably, a silicone resin), preferably the encapsulating resin layer 7 is formed of an encapsulating resin composition in a semi-cured (in a B-stage) state.

The compressive elastic modulus (25° C.) of the encapsulating resin layer 7 (the encapsulating resin layer 7 in a semi-cured state) is, for example, in view of encapsulating characteristics and handling ability, 0.01 MPa or more, or preferably 0.01 to 0.1 MPa.

When the compressive elastic modulus of the encapsulating resin layer 7 is below the above-described lower limit, there may be a case where the shape retention of the encapsulating resin layer 7 is reduced. In addition, when the compressive elastic modulus of the encapsulating resin layer 7 at 25° C. is within the above-described range, damage of a wire 12 and the light emitting diode 11 (described later, ref: FIG. 3) can be prevented, while the light emitting diode 11 (described later, ref: FIG. 3) can be surely embedded.

The compressive elastic modulus of the encapsulating resin layer 7 can be obtained by a compression test using a precision load measuring device.

The thickness of the encapsulating resin layer 7 is not particularly limited and is appropriately adjusted so that the light emitting diode 11 and the wire 12 can be embedded at the time of encapsulating the light emitting diode 11 to be described later.

When the light emitting diode 11 and a phosphor layer 5 (described later) are disposed in the neighborhood, the amount of the heat generation of the phosphor layer 5 at the time of lighting up of the LED device 2 (described later) is increased, so that the thickness of the encapsulating resin layer 7 is appropriately adjusted such that space between the light emitting diode 11 and the phosphor layer 5 (the sum of the thickness of the encapsulating resin layer 7 and the barrier layer 6 (described later)) is, for example, 1 mm or more.

To be specific, the thickness of the encapsulating resin layer 7 is, for example, 300 to 3000 μm, or preferably 500 to 2000 μm.

The encapsulating resin layer 7 can be formed of a single layer or a plurality of layers.

The wavelength conversion layer 8 laminated on the encapsulating resin layer 7 is formed by allowing the barrier layer 6 and the phosphor layer 5 to be laminated. To be specific, the barrier layer 6 is laminated on the encapsulating resin layer 7 and the phosphor layer 5 is laminated on the barrier layer 6.

The barrier layer 6 is formed of a light transmissive resin composition and is formed into a generally sheet state.

An example of the light transmissive resin composition includes a known transparent resin used in encapsulating the optical semiconductor element. An example of the transparent resin includes the same transparent resin as that described above.

The transparent resins can be used alone or in combination.

Of the transparent resins, preferably, a thermosetting resin is used, or more preferably, in view of durability, heat resistance, and light resistance, a silicone resin is used.

Of the light transmissive resin compositions, preferably a resin composition containing a silicone resin (the silicone resin composition) is used.

An example of the silicone resin composition includes the same silicone resin composition as that described above. Preferably, an addition reaction curable type silicone resin composition and a silicone resin composition containing an inorganic oxide are used.

The addition reaction curable type silicone resin composition contains a polysiloxane containing an ethylenically unsaturated hydrocarbon group used as a main agent and an organohydrogensiloxane used as a cross-linking agent.

The polysiloxane containing an ethylenically unsaturated hydrocarbon group is a liquid polysiloxane having ethylenically unsaturated hydrocarbon groups at both ends or an ethylenically unsaturated hydrocarbon group in its side chain.

An example of the ethylenically unsaturated hydrocarbon group includes the same ethylenically unsaturated hydrocarbon group as that described above. Preferably, an alkenyl group is used, or more preferably, a vinyl group is used.

Examples of the polysiloxane containing an ethylenically unsaturated hydrocarbon group include polydimethylsiloxane containing an alkenyl group, polymethylphenylsiloxane containing an alkenyl group, and polydiphenylsiloxane containing an alkenyl group.

The polysiloxanes containing an ethylenically unsaturated hydrocarbon group can be used alone or in combination.

An example of the organohydrogensiloxane includes the same organohydrogensiloxane as that described above.

The organohydrogensiloxanes can be used alone or in combination.

In the addition reaction curable type silicone resin composition, the polysiloxane containing an ethylenically unsaturated hydrocarbon group and the organohydrogensiloxane are usually provided in separate packages. To be specific, the addition reaction curable type silicone resin composition is provided as two liquids of A liquid containing a main agent (the polysiloxane containing an ethylenically unsaturated hydrocarbon group) and B liquid containing a cross-linking agent (the organohydrogensiloxane). A known catalyst that is necessary for the addition reaction of the polysiloxane containing an ethylenically unsaturated hydrocarbon group and the organohydrogensiloxane is added to the organohydrogensiloxane.

A commercially available product (trade name: KER-2500, manufactured by Shin-Etsu Chemical Co., Ltd., a dimethylsiloxane skeleton derivative; trade name: LR-7665, manufactured by WACKER ASAHIKASEI SILICONE CO., LTD., a dimethylsiloxane skeleton derivative) can be used as the addition reaction curable type silicone resin composition.

In the addition reaction curable type silicone resin composition, the main agent (A liquid) and the cross-linking agent (B liquid) are mixed and are, as described later, applied onto the phosphor layer 5. Thereafter, the applied mixture is heated and dried, so that the contained polysiloxane containing an ethylenically unsaturated hydrocarbon group and organohydrogensiloxane are subjected to the addition reaction to form a silicone elastomer.

The silicone resin composition containing an inorganic oxide contains, for example, a polysiloxane containing alkoxysilyl groups and inorganic oxide particles containing a reactive functional group.

The polysiloxane containing alkoxysilyl groups is a polysiloxane having, in one molecule, at least two alkoxysilyl groups. Examples thereof include a polysiloxane formed of a silicone monomer represented by formula (6) below, a polysiloxane formed of a silicone monomer represented by formula (7) below, and a polysiloxane formed of a silicone monomer represented by formulas (6) and (7) below.

Formula (6):

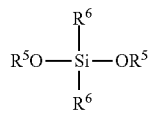

(6)

(where, in formula (6), $R^5$ and $R^6$ represent a monovalent hydrocarbon group selected from a saturated hydrocarbon group and an aromatic hydrocarbon group.)

Formula (7):

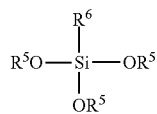

(7)

(where, in formula (7), $R^5$ and $R^6$ represent a monovalent hydrocarbon group selected from a saturated hydrocarbon group and an aromatic hydrocarbon group.)

In formulas (6) and (7), an example of the monovalent hydrocarbon group represented by $R^5$ includes the same monovalent hydrocarbon group as that represented by the above-described formula (1).

Of the monovalent hydrocarbon groups, preferably, a saturated hydrocarbon group is used, more preferably, an alkyl group having 1 to 6 carbon atoms is used, or particularly preferably, a methyl group is used.

In formulas (6) and (7), an example of the monovalent hydrocarbon group represented by $R^6$ includes the same monovalent hydrocarbon group as that represented by the above-described formula (1).

Of the monovalent hydrocarbon groups, preferably, an alkyl group having 1 to 6 carbon atoms and an aryl group having 6 to 10 carbon atoms are used, or more preferably, a methyl group is used.

Examples of the silicone monomer represented by the above-described formula (6) include dialkyldialkoxysilane such as dimethyldimethoxysilane and dimethyldiethoxysilane, diaryldialkoxysilane such as diphenyldimethoxysilane and diphenyldiethoxysilane, and alkylaryldialkoxysilane such as methylphenyldimethoxysilane and methylphenyldiethoxysilane.

Of the silicone monomers represented by the above-described formula (6), preferably, dialkyldialkoxysilane is used, or more preferably, dimethyldimethoxysilane is used.

The polysiloxane formed of the silicone monomer represented by the above-described formula (6) is a condensation product of the silicone monomer represented by the above-described formula (6) and the basic constituent unit thereof is a D unit (formula (8) below).

Formula (8):

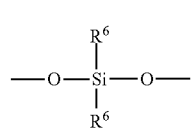

(8)

(where, in formula (8), $R^6$ represents the same monovalent hydrocarbon group as that of $R^6$ in the above-described formula (6).)

Examples of the polysiloxane formed of the silicone monomer represented by the above-described formula (6) include polydimethylsiloxane containing alkoxysilyl groups at both ends, polymethylphenylsiloxane containing alkoxysilyl groups at both ends, and polydiphenylsiloxane containing alkoxysilyl groups at both ends.

The polysiloxanes formed of the silicone monomer represented by the above-described formula (6) can be used alone or in combination.

Of the polysiloxanes formed of the silicone monomer represented by the above-described formula (6), preferably, polysiloxane containing methoxysilyl groups at both ends is used, or more preferably, polydimethylsiloxane containing methoxysilyl groups at both ends is used.

The alkoxysilyl group content in the polysiloxane formed of the silicone monomer represented by the above-described formula (6) is, for example, 20 to 65 mass %, or preferably 24 to 62 mass %.

Examples of the silicone monomer represented by the above-described formula (7) include alkyltrialkoxysilane such as methyltrimethoxysilane and methyltriethoxysilane, aryltrialkoxysilane such as phenyltrimethoxysilane and phenyltriethoxysilane, and alkylaryltrialkoxysilane such as methylphenyltrimethoxysilane and methylphenyltriethoxysilane.

Of the silicone monomers represented by the above-described formula (7), preferably, alkyltrialkoxysilane is used, or more preferably, methyltrimethoxysilane is used.

The polysiloxane formed of the silicone monomer represented by the above-described formula (7) is a partial condensation product of the silicone monomer represented by the above-described formula (7) and the basic constituent unit thereof is a T unit (formula (9) below). In the constituent unit thereof, the constituent unit represented by formula (10) below and/or the constituent unit represented by formula (11) below are/is contained.

Formula (9):

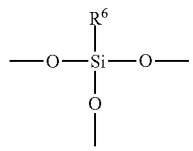

(9)

(where, in formula (9), $R^6$ represents the same monovalent hydrocarbon group as that of $R^6$ in the above-described formula (7).)

Formula (10):

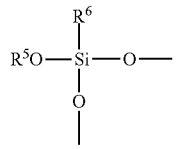

(10)

(where, in formula (10), $R^5$ and $R^6$ represent the same monovalent hydrocarbon group as that of $R^5$ and $R^6$ in the above-described formula (7).)

Formula (11):

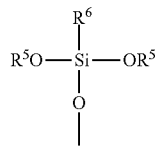

(11)

(where, in formula (11), $R^5$ and $R^6$ represent the same monovalent hydrocarbon group as that of $R^5$ and $R^6$ in the above-described formula (7).)

An example of the polysiloxane formed of the silicone monomer represented by the above-described formula (7) includes silsesquioxane containing an alkoxysilyl group.

Examples of the silsesquioxane containing an alkoxysilyl group include silsesquioxanes containing an alkoxysilyl group having various structures such as a random structure, a ladder structure, and a cage structure.

The silsesquioxanes containing an alkoxysilyl group can be used alone or in combination.

Of the silsesquioxanes containing an alkoxysilyl group, preferably, silsesquioxane containing an alkoxysilyl group having a random structure is used, more preferably, silsesquioxane containing a methoxysilyl group is used, or particularly preferably, polymethylsilsesquioxane containing a methoxysilyl group is used.

The alkoxysilyl group content in the silsesquioxane containing an alkoxysilyl group is, for example, 15 to 80 mass %, or preferably 20 to 76 mass %.

A commercially available product (trade name: X-40-9225, manufactured by Shin-Etsu Chemical Co., Ltd.) can be used as the polysiloxane formed of the silicone monomer represented by the above-described formula (7).

The polysiloxane formed of the silicone monomer represented by the above-described formulas (6) and (7) is a partial condensation product of the silicone monomer represented by the above-described formula (6) and the silicone monomer represented by the above-described formula (7) at an arbitrary ratio. In the constituent unit thereof, the D unit (the above-described formula (8)) and the T unit (the above-described formula (9)) are contained.

The polysiloxane formed of the silicone monomer represented by the above-described formulas (6) and (7) further contains, in its constituent unit, for example, a constituent unit represented by formula (12) below.

Formula (12):

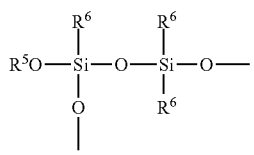

(12)

(where, in formula (12), $R^5$ and $R^6$ represent the same monovalent hydrocarbon group as that of $R^5$ and $R^6$ in the above-described formula (6).)

The alkoxysilyl group content in the polysiloxane formed of the silicone monomer represented by the above-described formulas (6) and (7) is, for example, 5 to 55 mass %, or preferably 10 to 30 mass %.

A commercially available product (trade name: X-40-9246, manufactured by Shin-Etsu Chemical Co., Ltd.) can be used as the polysiloxane formed of the silicone monomer represented by the above-described formulas (6) and (7).

The polysiloxanes containing alkoxysilyl groups can be used alone or in combination.

Of the polysiloxanes containing alkoxysilyl groups, preferably, polysiloxane formed of the silicone monomer represented by the above-described formula (7) and polysiloxane formed of the silicone monomer represented by the above-described formulas (6) and (7) are used, or more preferably, polysiloxane formed of the silicone monomer represented by the above-described formula (7) and polysiloxane formed of the silicone monomer represented by the above-described formulas (6) and (7) are used in combination.

The mixing ratio of the polysiloxane containing alkoxysilyl groups is, for example, 60 to 95 parts by mass, or preferably 70 to 90 parts by mass with respect to 100 parts by mass of the silicone resin composition containing an inorganic oxide.

When the polysiloxane containing alkoxysilyl groups contains the polysiloxane formed of the silicone monomer represented by the above-described formula (7), the mixing ratio of the polysiloxane formed of the silicone monomer represented by the above-described formula (7) is, for example, 10 to 50 parts by mass, or preferably 20 to 40 parts by mass with respect to 100 parts by mass of the silicone resin composition containing an inorganic oxide.

When the polysiloxane containing alkoxysilyl groups contains the polysiloxane formed of the silicone monomer represented by the above-described formulas (6) and (7), the mixing ratio of the polysiloxane formed of the silicone monomer represented by the above-described formulas (6) and (7) is, for example, 20 to 70 parts by mass, or preferably 30 to 60 parts by mass with respect to 100 parts by mass of the silicone resin composition containing an inorganic oxide.

The inorganic oxide particles containing a reactive functional group are inorganic oxide particles having a reactive functional group on the surfaces of the particles.

Examples of the reactive functional group include a hydroxyl group, an isocyanate group, an amino group, a mercapto group, a carboxy group, an epoxy group, a vinyl unsaturated group, a halogen group, and an isocyanurate group.

Of the reactive functional groups, preferably a hydroxyl group is used.

Examples of the inorganic oxide particles include titanium oxide, zirconium oxide, barium titanate, zinc oxide, lead titanate, and silica (silicon dioxide).

The inorganic oxide particles can be used alone or in combination.

Of the inorganic oxide particles, preferably silica (silicon dioxide) is used.

The inorganic oxide particles containing a reactive functional group are prepared as a sol of the inorganic oxide particles. Preferably, a colloidal silica sol is used.

The mixing ratio of the inorganic oxide particles containing a reactive functional group is, for example, 5 to 50 parts by mass, or preferably 10 to 40 parts by mass with respect to 100 parts by mass of the polysiloxane containing alkoxysilyl groups.

A commercially available product (trade name: Snowtex OS, manufactured by NISSAN CHEMICAL INDUSTRIES, LTD.) can be used as the inorganic oxide particles containing a reactive functional group.

The polysiloxane containing alkoxysilyl groups and the inorganic oxide particles containing a reactive functional group are blended at the above-described ratio to be mixed, so that the silicone resin composition containing an inorganic oxide is prepared.

The silicone resin composition containing an inorganic oxide can be prepared in accordance with the description in Japanese Unexamined Patent Publication No. 2010-150342.

The prepared silicone resin composition containing an inorganic oxide is, for example, in a liquid state (in an oil state). As described later, the prepared silicone resin composition containing an inorganic oxide is applied onto the phosphor layer 5 and then is heated, so that the contained polysiloxane containing alkoxysilyl groups (to be specific, the polysiloxane formed of the silicone monomer represented by the above-described formula (7) and the polysiloxane formed of the silicone monomer represented by the above-described formulas (6) and (7)) is subjected to the condensation reaction to form the silicone resin containing an inorganic oxide.

A filler (inorganic particles) and furthermore, a known additive can be added to the above-described light transmissive resin composition at an appropriate ratio as required. Examples of the known additive include curing agents, curing accelerators, antioxidants, modifiers, surfactants, dyes, pigments, discoloration inhibitors, and ultraviolet absorbers.

An example of the filler includes the above-described filler.

The fillers can be used alone or in combination.

Of the fillers, preferably silica (silicon dioxide) and the silicone resin microparticles are used.

A preferable example of the combination of the light transmissive resin composition and the filler includes the combination of the silicone resin composition and the silicone resin microparticles when considering the brightness of the LED device 2 (described later).

When the silicone resin microparticles are added to the silicone resin composition, the hardness of the barrier layer 6 after curing can be improved and backscattering in the barrier layer 6 can be prevented compared with the case where another filler is added thereto. As a result, a brightness loss of the LED device 2 (described later) can be suppressed and the brightness of the LED device 2 (described later) can be improved.

An example of the silicone resin microparticles includes polysilsesquioxane microparticles. When considering the hardness of the barrier layer 6 after curing, preferably polymethylsilsesquioxane microparticles are used.

The average particle size (the average of the maximum length) of the silicone resin microparticle is, for example, 0.2 to 40 μm, or preferably 0.5 to 10 μm.

When the filler is the silica (silicon dioxide), the addition ratio thereof is, for example, 1 to 60 parts by mass, or preferably 5 to 50 parts by mass with respect to 100 parts by mass of the light transmissive resin composition.

When the filler is the silicone resin microparticles, the addition ratio thereof is, for example, 1 to 60 parts by mass, or preferably 10 to 50 parts by mass with respect to 100 parts by mass of the light transmissive resin composition.

The light transmissive resin composition is subjected to a defoaming process as required after the preparation thereof.

An example of the defoaming method includes the above-described known defoaming method. Preferably, reduced pressure defoaming (vacuum defoaming) is used.

When the defoaming method is the reduced pressure defoaming (vacuum defoaming), defoaming conditions are as follows: a temperature of, for example, 10 to 40° C., or preferably 15 to 35° C. and a duration of, for example, 10 minutes or more, or preferably 30 minutes or more.

The thickness of the barrier layer 6 is, for example, 200 to 1000 μm, or preferably 200 to 800 μm.

When the thickness of the barrier layer 6 is below 200 μm, there may be a case where the inhibiting effect on bleeding is insufficient. When the thickness of the barrier layer 6 exceeds 1000 μm, there may be a case where the cost is increased.

The elastic modulus of the barrier layer 6 is, for example, 2 MPa to 500 MPa, or preferably 3 MPa to 300 MPa.

When the elastic modulus of the barrier layer 6 is below 2 MPa, there may be a case where the shape retention of the encapsulating layer 10 (described later) is reduced. When the elastic modulus of the barrier layer 6 exceeds 500 MPa, there may be a case where the handling ability of the encapsulating sheet 1 is reduced.

The elastic modulus of the barrier layer 6 is obtained with a tensile testing machine (manufactured by Shimazu Corporation, Autograph AGS-J).

The barrier layer 6 can be formed of a single layer or a plurality of layers.

The phosphor layer 5 is formed of a resin composition containing a phosphor and is formed into a generally sheet state.

The resin composition containing a phosphor contains at least one kind of phosphor and a resin composition.

The phosphor is a particle having a wavelength conversion function. The phosphor is not particularly limited as long as it is a known phosphor used in an optical semiconductor element device. An example of the phosphor includes a known phosphor such as a yellow phosphor that is capable of converting blue light into yellow light and a red phosphor that is capable of converting the blue light into red light.

Examples of the yellow phosphor include a garnet type phosphor having a garnet type crystal structure such as $Y_3Al_5O_{12}$:Ce (YAG (yttrium aluminum garnet):Ce) and $Tb_3Al_3O_{12}$:Ce (TAG (terbium aluminum garnet):Ce) and an oxynitride phosphor such as Ca-α-SiAlON.

An example of the red phosphor includes a nitride phosphor such as $CaAlSiN_3$:Eu and $CaSiN_2$:Eu.

Of the phosphors, preferably, a yellow phosphor is used, more preferably, Ca-α-SiAlON and YAG:Ce are used, or particularly preferably, YAG:Ce is used.

The phosphors can be used alone or in combination.

The phosphor is in the form of a particle. The shape thereof is not particularly limited and examples of the shape thereof include a generally sphere shape, a generally flat plate shape, and a generally needle shape.

The average particle size (the average of the maximum length) of the phosphor is, for example, 0.1 to 500 μm, or preferably 0.2 to 200 μm. The average particle size of the phosphor particle is measured with a particle size distribution analyzer.

The resin composition contains, for example, a known transparent resin used in encapsulating the optical semiconductor element. An example of the transparent resin includes the same transparent resin as that described above.

The transparent resins can be used alone or in combination.

Of the transparent resins, preferably, a thermosetting resin is used, or more preferably, in view of durability, heat resistance, and light resistance, a silicone resin is used.

Of the resin compositions, preferably the resin composition containing a silicone resin (the silicone resin composition) is used.

An example of the silicone resin composition includes the same silicone resin composition as that described above. Preferably, the above-described addition reaction curable type silicone resin composition is used.

When the resin composition is the addition reaction curable type silicone resin composition, the cross-linking number of the siloxane skeleton can be appropriately adjusted by a known method such that the phosphor layer 5 has a low modulus enabling the phosphor layer 5 to maintain a constant thickness thereof even when subjected to the external force or a pressure at the time of encapsulating.

A commercially available product (for example, LR7665 manufactured by WACKER ASAHIKASEI SILICONE CO., LTD.) can be used as the addition reaction curable type silicone resin composition. An addition reaction curable type silicone resin composition synthesized in accordance with a known method can also be used.

To prepare the resin composition containing a phosphor, the above-described phosphor and resin composition (preferably, the addition reaction curable type silicone resin composition) are blended to be stirred and mixed.

To be specific, when the resin composition is the addition reaction curable type silicone resin composition, the phosphor is blended into a liquid mixture obtained by mixing the main agent (A liquid) and the cross-linking agent (B liquid) to be stirred and mixed.

The degree of whitening is different in accordance with the type of the phosphor, the thickness of the phosphor layer, and the shape of the encapsulating sheet, so that the mixing ratio of the phosphor is not particularly limited and is, for example, 1 to 50 mass %, or preferably 10 to 40 mass % with respect to the resin composition containing a phosphor.

The stirring temperature is, for example, room temperature (about 25° C.) to 50° C. and the stirring duration is, for example, 1 minute to 180 minutes.

The liquid mixture blended with the phosphor is applied onto a release sheet 9, as described later, and then is heated to be dried, so that the contained polysiloxane containing an ethylenically unsaturated hydrocarbon group and organohydrogensiloxane are subjected to the addition reaction to form a silicone elastomer containing a phosphor.

A known additive can be added to the resin composition containing a phosphor at an appropriate ratio as required. Examples of the known additive include fillers (inorganic particles), curing agents, curing accelerators, antioxidants, modifiers, surfactants, dyes, pigments, discoloration inhibitors, and ultraviolet absorbers.

The resin composition containing a phosphor is subjected to a defoaming process as required after the preparation thereof.

An example of the defoaming method includes the above-described known defoaming method. Preferably, reduced pressure defoaming (vacuum defoaming) is used.

When the defoaming method is the reduced pressure defoaming (vacuum defoaming), defoaming conditions are as follows: a temperature of, for example, 10 to 40° C., or preferably 15 to 35° C. and a duration of, for example, 10 minutes or more, or preferably 30 minutes or more.

The thickness of the phosphor layer 5 is not particularly limited and is, for example, 20 to 300 μm, preferably, in view of whitening, 30 to 200 μm, or more preferably 70 to 120 μm.

Next, a method for producing the encapsulating sheet 1 is described with reference to FIG. 2.

Figure 2:
FIG. 2 shows process drawings for illustrating the steps for producing one embodiment of the encapsulating sheet of the present invention.
Figure 2:
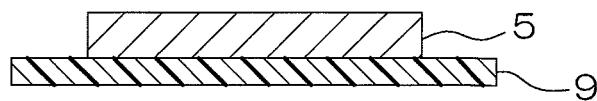
Figure 2:
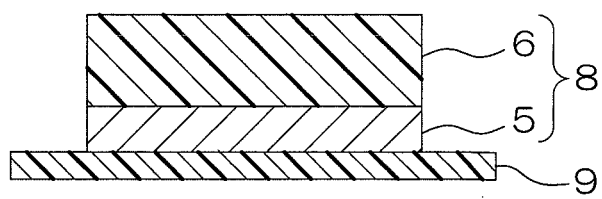
Figure 2:
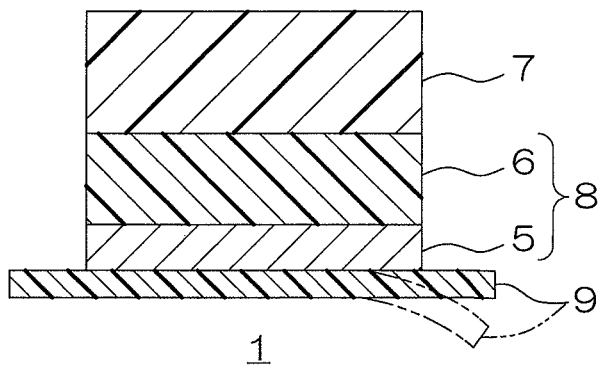

In this method, as shown in FIG. 2 (a), the release sheet 9 is first prepared.

The release sheet 9 is used as a protecting sheet that covers and protects the surface (the phosphor layer 5) of the encapsulating sheet 1 and as a coating substrate of the encapsulating sheet 1.

Examples of the release sheet 9, though not particularly limited, include a polyester film such as a polyethylene terephthalate (PET) film; a polycarbonate film; a polyolefin film such as a polyethylene film and a polypropylene film; a polystyrene film; an acrylic film; and a resin film such as a silicone resin film and a fluorine resin film.

Of the release sheets 9, preferably a polyester film is used.

A release treatment is performed on the top surface (the surface on the side where the phosphor layer 5 is to be formed) of the release sheet 9 as required so as to increase the release characteristics from the phosphor layer 5.

The thickness of the release sheet 9 is not particularly limited and is, for example, in view of handling ability and cost, 20 to 100 μm, or preferably 30 to 80 μm.

Next, as shown in FIG. 2 (b), the phosphor layer 5 is laminated on the release sheet 9.

A method (a laminating method of the phosphor layer 5) for laminating the phosphor layer 5 on the release sheet 9 is not particularly limited. Examples of the method include a method for forming the phosphor layer 5 directly on the release sheet 9 and a method for attaching the phosphor layer 5 onto the release sheet 9 after forming the phosphor layer 5 on another film or the like.

Of the laminating methods, preferably a method for forming the phosphor layer 5 directly on the release sheet 9 is used. To be specific, the resin composition containing a phosphor is first applied onto the release sheet 9 with the above-described thickness by a known application method such as a casting, a spin coating, and a roll coating, so that the phosphor layer 5 is formed.

When the resin composition containing a phosphor contains the thermosetting resin, the phosphor layer 5 is heated and dried to be cured.

Curing conditions are as follows: a heating temperature of, for example, 80 to 150° C., or preferably 90 to 150° C. and a heating duration of, for example, 1 to 100 minutes, or preferably 5 to 15 minutes.

Next, as shown in FIG. 2 (c), the barrier layer 6 is laminated on the phosphor layer 5.

To be specific, the barrier layer 6 is laminated on the upper surface (one surface at the opposite side of the other surface in contact with the release sheet 9 in the phosphor layer 5) of the phosphor layer 5.

Examples of the method for laminating the barrier layer 6 on the phosphor layer 5 include a method for forming the barrier layer 6 directly on the phosphor layer 5 and a method for attaching the barrier layer 6 onto the phosphor layer 5 after forming the barrier layer 6 on another film or the like.

In the method for forming the barrier layer 6 directly on the phosphor layer 5, the light transmissive resin composition is first applied onto the entire one surface of the phosphor layer 5 by a known application method such as a casting, a spin coating, and a roll coating, so that the barrier layer 6 is formed.

When the light transmissive resin composition contains the thermosetting resin, the barrier layer 6 is heated, so that the barrier layer 6 formed of the light transmissive resin composition is formed into a cured state.

Heating conditions are as follows: a temperature of, for example, 50 to 250° C., or preferably 100 to 200° C. and a heating duration of, for example, 1 to 100 minutes, or preferably 5 to 15 minutes.

In the method for attaching the barrier layer 6 onto the phosphor layer 5 after forming the barrier layer 6 on another film or the like, the light transmissive resin composition is first applied onto another film by a known application method such as a casting, a spin coating, and a roll coating, so that the barrier layer 6 is formed.

When the light transmissive resin composition contains the thermosetting resin, the barrier layer 6 is heated, so that the barrier layer 6 formed of the light transmissive resin composition is cured.

Drying conditions are as follows: a temperature of, for example, 50 to 300° C., or preferably 80 to 250° C. and a duration of, for example, 1 to 100 minutes, or preferably 10 to 80 minutes.

The drying is performed in two steps as required. To be specific, in the first step, the drying is performed under a low temperature condition and in the second step, the drying is performed under a high temperature condition.

Low temperature drying conditions are as follows: a temperature of, for example, 50 to 150° C., or preferably 80 to 120° C. and a duration of, for example, 1 to 80 minutes, or preferably 10 to 60 minutes.

High temperature drying conditions are as follows: a temperature of, for example, 150 to 300° C., or preferably 180 to 220° C. and a duration of, for example, 1 to 120 minutes, or preferably 30 to 80 minutes.

Next, the barrier layer 6 is peeled off from another film to be attached onto the phosphor layer 5 by, for example, a laminator, a thermal compression bonding, or the like.

To be specific, the above-described addition reaction curable type silicone resin composition and the like are applied onto the top surface of the phosphor layer 5 and then, the barrier layer 6 is attached onto the applied surface.

In this way, the barrier layer 6 is laminated on the upper surface of the phosphor layer 5 to form the wavelength conversion layer 8.

Next, as shown in FIG. 2 (d), the encapsulating resin layer 7 is laminated on the upper surface of the wavelength conversion layer 8.

To be specific, the encapsulating resin layer 7 is laminated on the upper surface (one surface at the opposite side of the other surface in contact with the phosphor layer 5 in the barrier layer 6) of the barrier layer 6.

To laminate the encapsulating resin layer 7 on the barrier layer 6, for example, the encapsulating resin composition is applied onto the entire one surface of the barrier layer 6 by, for example, a known application method such as a casting, a spin coating, and a roll coating, so that the encapsulating resin layer 7 is formed.

When the encapsulating resin composition contains the thermosetting resin, the encapsulating resin layer 7 is heated, so that the encapsulating resin layer 7 formed of the encapsulating resin composition is brought into a semi-cured state.

Heating conditions are as follows: a temperature of, for example, 50 to 150° C., or preferably 80 to 120° C. and a heating duration of, for example, 1 to 100 minutes, or preferably 5 to 15 minutes.

In this way, the encapsulating resin layer 7 is laminated on the upper surface of the barrier layer 6.

As described above, the encapsulating sheet 1 is prepared.

As shown in FIG. 1, in the encapsulating sheet 1, the barrier layer 6 is laminated on the encapsulating resin layer 7 and the phosphor layer 5 is laminated on the barrier layer 6.

The size of the encapsulating sheet 1 is not particularly limited as long as the encapsulating sheet 1 is capable of encapsulating the light emitting diode 11 and the wire 12 (described later). The size of the encapsulating sheet 1 is larger by, for example, 1 to 20 mm, or preferably 2 to 10 mm than the outer circumference line of the projected surface in an up-down direction of the light emitting diode 11 and the wire 12 (described later). When a plurality of the light emitting diodes 11 and a plurality of the wires 12 are collectively encapsulated, the size of the encapsulating sheet 1 is larger by, for example, 1 to 20 mm, or preferably 2 to 10 mm than the outer circumference line of the projected surface in the up-down direction of the light emitting diode 11 and the wire 12, each of which are located at the most outer side.

When the size of the encapsulating sheet 1 is below the above-described range, there may be a case where blue light emitted from the light emitting diode 11 (described later) is not sufficiently converted to yellow light, so that white characteristics of white light are reduced. When the size of the encapsulating sheet 1 exceeds the above-described range, there may be a case where angle dependence of color tone is poor and the cost is increased.

The above-described encapsulating sheet 1 is formed into a generally rectangular shape. However, the shape of the encapsulating sheet 1 is not particularly limited to this and can be appropriately changed according to its necessity. To be specific, the shape thereof can be formed into a generally cylindrical column shape, a generally tapered cylindrical column shape (a shape in which the diameter is gradually reduced toward the upper side), or the like.

Next, a method for producing the LED device 2, as one example of an optical semiconductor element device, by encapsulating the light emitting diode 11, as one example of an optical semiconductor element, using the encapsulating sheet 1, is described with reference to FIG. 3.

In this method, as shown in FIG. 3 (a), the encapsulating sheet 1 and a board 14 are first prepared.

The board 14 is formed into a generally flat plate shape that is larger than the encapsulating sheet 1.

The board 14 is provided with a terminal (not shown) formed on the upper surface thereof, the light emitting diode 11 mounted on the central portion thereof, and the wire 12 for electrically connecting the light emitting diode 11 to the terminal (not shown). A plurality of the light emitting diodes 11 can be mounted on the board 14 as required.

The light emitting diode 11 is, for example, an optical semiconductor element capable of emitting the blue light and is formed into a generally rectangular shape in sectional view.

The light emitting diode 11 and the wire 12 can be protected (covered) by a potting resin composition 13 so as to prevent the light emitting diode 11 and the wire 12 from being damaged due to the external force or a pressure at the time of molding.

The potting resin composition 13 is not particularly limited as long as it is a known resin composition used in encapsulating the optical semiconductor element. An example of the potting resin composition 13 includes the same resin composition as the above-described encapsulating resin composition.

The potting resin compositions 13 can be used alone or in combination.

Of the potting resin compositions 13, preferably, in view of durability, heat resistance, and light resistance, the above-described silicone resin composition is used.

The used amount of the potting resin composition 13 is not particularly limited as long as it is capable of covering the light emitting diode 11 and the wire 12 and is, for example, 2 to 20 mg, or preferably 3 to 10 mg.

When the used amount of the potting resin composition 13 exceeds 20 mg, there may be a case where a molding defect of the encapsulating resin layer 7 occurs when the light emitting diode 11 and the wire 12 are encapsulated by the encapsulating sheet 1. When the used amount of the potting resin composition 13 is below 2 mg, there may be a case where the light emitting diode 11 and the wire 12 are not sufficiently covered.

The fillers (inorganic particles) can be added to the potting resin composition 13 at an appropriate ratio as required.

An example of the fillers (inorganic particles) includes the above-described fillers.

The fillers can be used alone or in combination.

As shown in FIG. 3 (a), the encapsulating sheet 1 is disposed at the upper side of the prepared board 14.

To be specific, the encapsulating resin layer 7 of the encapsulating sheet 1 and the light emitting diode 11 mounted on the board 14 are disposed so as to be opposed to each other in the up-down direction.

Next, as shown in FIG. 3 (b), the encapsulating sheet 1 is attached to the board 14 to encapsulate the light emitting diode 11 and the wire 12.

To be specific, the encapsulating sheet 1 is flat plate pressed under predetermined conditions, so that the light emitting diode 11 and the wire 12 are covered by the encapsulating sheet 1. As a result, the encapsulating sheet 1 is adhered to the light emitting diode 11 and the board 14.

Pressing conditions are as follows: a temperature of, for example, 80 to 220° C., or preferably 100 to 200° C. and a pressure of, for example, 0.01 to 1 MPa, or preferably 0.01 to 0.5 MPa.

At this time, the light emitting diode 11 and the wire 12 are housed in the encapsulating resin layer 7.

In FIG. 3 (b), the encapsulating sheet 1 is flat plate pressed under predetermined conditions and is adhered to the light emitting diode 11 and the board 14. However, the method for adhering the encapsulating sheet 1 is not limited to this. As shown in FIG. 4, for example, it is also possible that a metal mold die is pressed toward the encapsulating sheet 1 under predetermined conditions (ref: FIG. 4 (a)), so that the encapsulating sheet 1 is adhered to the light emitting diode 11 and the board 14, while being molded into a predetermined shape (for example, a generally pentagonal shape in side view) (ref: FIG. 4 (b)).

Next, when the encapsulating resin layer 7 of the encapsulating sheet 1 is formed of the thermosetting resin, the encapsulating resin layer 7 is cured under predetermined conditions and the encapsulating sheet 1 is formed as the encapsulating layer 10.

Curing conditions are the conditions in which the thermosetting resin of the encapsulating resin layer 7 described above is completely cured, the conditions in which the addition reaction (the hydrosilylation reaction) is progressed when the encapsulating resin composition is the condensation/addition reaction curable type silicone resin composition, and the conditions in which the reaction of the modified silicone resin composition containing a hetero atom is completely progressed when the encapsulating resin composition is the modified silicone resin composition containing a hetero atom.

To be specific, the heating temperature is, for example, 80 to 200° C., or preferably 100 to 180° C. and the heating duration is, for example, 1 to 30 minutes, or preferably 1 to 10 minutes.

Next, the release sheet 9 is peeled off.

As described above, the LED device 2 in which the light emitting diode 11 is encapsulated by the encapsulating sheet 1 is fabricated.

When the encapsulating resin layer 7 is formed of the thermosetting resin, the LED device 2 including the light emitting diode 11 and the encapsulating layer 10 that encapsulates the light emitting diode 11 is fabricated.

In the LED device 2, before the release sheet 9 is peeled off, pressure molding is performed by the flat plate pressing, so that the encapsulating sheet 1 is adhered to the light emitting diode 11 and the board 14. However, the method for fabricating the LED device 2 is not limited to this. Alternatively, for example, it is also possible that after the release sheet 9 is peeled off, the pressure molding is performed by the flat plate pressing or with the metal mold die, so that the encapsulating sheet 1 is adhered to the light emitting diode 11 and the board 14 and then, the release sheet 9 is peeled off.

In the encapsulating sheet 1, the wavelength conversion layer 8 in which the barrier layer 6 and the phosphor layer 5 are laminated is laminated on the encapsulating resin layer 7. To be specific, the barrier layer 6 is laminated on the encapsulating resin layer 7 and the phosphor layer 5 is laminated on the barrier layer 6.

Therefore, in the LED device 2 in which the light emitting diode 11 is encapsulated by the encapsulating sheet 1, even when the light emitting diode 11 and the phosphor layer 5 generate heat along with the light emission, a bleeding of a residual monomer (an unreacted liquid resin) in the encapsulating resin layer 7 can be suppressed by the barrier layer 6. As a result, it is possible to improve the appearance of the LED device 2.

In the above-described encapsulating sheet 1, the barrier layer 6 is laminated on the encapsulating resin layer 7 and the phosphor layer 5 is laminated on the barrier layer 6. Alternatively, as shown in FIG. 5, it is also possible that the phosphor layer 5 is laminated on the encapsulating resin layer 7 and the barrier layer 6 is laminated on the phosphor layer 5.

Also, in this way, the same effect as in the above-described encapsulating sheet 1 can be obtained.

EXAMPLES

While the present invention will be described hereinafter in further detail with reference to Prepared Examples, Examples, and Comparative Examples, the present invention is not limited to these Prepared Examples, Examples, and Comparative Examples.

Preparation of Resin Composition Containing Phosphor

Prepared Example 1

26 g of YAG:Ce was mixed to 74 g of a mixed solution (mixing ratio (A/B)=1/1) in which A liquid (a polysiloxane containing an ethylenically unsaturated hydrocarbon group) and B liquid (an organohydrogensiloxane) of an addition reaction curable type silicone resin composition (LR7665, manufactured by WACKER ASAHIKASEI SILICONE CO., LTD.) were mixed to be stirred for 1 hour. After the stirring, the obtained mixture was subjected to a defoaming process under reduced pressure with a vacuum dryer at room temperature for 30 minutes or more.

In this way, a resin composition containing a phosphor was prepared (a phosphor concentration of 26 mass %).

Preparation of Encapsulating Resin Composition

Prepared Example 2

Preparation of Encapsulating Resin Composition A 15.76 g (0.106 moles) of vinyltrimethoxysilane (an ethylenic silicon compound) and 2.80 g (0.0118 moles) of (3-glycidoxypropyl)trimethoxysilane (a silicon compound containing an epoxy group) were blended into 2031 g (0.177 moles) of polydimethylsiloxane containing silanol groups at both ends (polysiloxane containing silanol groups at both ends, in formula (1), all of $R^1$s are methyl groups, the average of "n" is 155, a number average molecular weight of 11500, a silanol group equivalent of 0.174 mmol/g), which was heated at 40° C., and the obtained mixture was stirred and mixed.

The molar ratio (the mole number of the SiOH group/the total mole number of the $SiOCH_3$ group) of the SiOH group in the polydimethylsiloxane containing silanol groups at both ends to the $SiOCH_3$ group in the vinyltrimethoxysilane and (3-glycidoxypropyl)trimethoxysilane was 1/1.

After the stirring and mixing, 0.97 mL (0.766 g, a catalyst content: 0.88 mm moles, corresponding to 0.50 moles with respect to 100 moles of the polydimethylsiloxane containing silanol groups at both ends) of a methanol solution of tetramethylammonium hydroxide (a condensation catalyst, a condensation of 10 mass %) was added to the obtained mixture to be stirred at 40° C. for 1 hour. The obtained mixture (oil) was stirred under reduced pressure (10 mmHg) at 40° C. for 1 hour and volatile components (methanol or the like) were removed.

Thereafter, the pressure of the system was brought back to the normal pressure and then, 44.5 g (0.022 moles) of an organohydrogensiloxane (manufactured by Shin-Etsu Chemical Co., Ltd., an average molecular weight of 2000, a hydrosilyl group equivalent of 7.14 mmol/g) was added to the reactant to be stirred at 40° C. for 1 hour.

The molar ratio ($CH_2$=CH—/SiH) of the vinyl group ($CH_2$=CH—) in the vinyltrimethoxysilane to the hydrosilyl group (the SiH group) in the organohydrogensiloxane was 1/3.

Thereafter, 0.13 g (0.13 mL, a platinum content of 2 mass %, as a platinum, corresponding to $5.8 \times 10^{-3}$ parts by mass with respect to 100 parts by mass of the organohydrogensiloxane) of a siloxane solution of a platinum carbonyl complex (an addition catalyst, a platinum concentration of 2 mass %) was added to the system to be stirred at 40° C. for 10 minutes, so that a mixture (oil) was obtained.

Next, 10 g of a filler A (silicon dioxide, trade name: FB-3SDC, manufactured by DENKI KAGAKU KOGYO KABUSHIKI KAISHA., an average particle size of 3.4 μm) was added to 90 g of the mixture (oil) to be stirred at room temperature (20° C.) for 10 minutes. After the stirring, the obtained mixture was subjected to a defoaming process under reduced pressure with a vacuum dryer at room temperature for 30 minutes or more.

In this way, an encapsulating resin composition A was prepared (a filler content of 10 mass %).

Prepared Example 3

Preparation of Encapsulating Resin Composition B 600 g (0.200 moles) of a dual-end silanol type silicone oil (trade name: KF-9701, manufactured by Shin-Etsu Chemical Co., Ltd., an average molecular weight of 3000) and 8.22 g (40.2 moles) of aluminum isopropoxide were stirred and mixed at room temperature (25° C.) for 24 hours, so that a mixture was prepared.

Next, the obtained mixture was centrifuged to remove insoluble substances and the resulting mixture was concentrated under reduced pressure at 50° C. for 2 hours, so that a polyaluminosiloxane oil was obtained.

Next, 10 parts by mass of a methacrylic silane coupling agent (trade name: KBM-503, manufactured by Shin-Etsu Chemical Co., Ltd.) was added to 100 parts by mass of the obtained polyaluminosiloxane oil to be stirred under reduced pressure at 80° C. for 10 minutes.

Next, 10 g of a filler A (silicon dioxide, trade name: FB-3SDC, manufactured by DENKI KAGAKU KOGYO KABUSHIKI KAISHA., an average particle size of 3.4 μm) was added to 90 g of the polyaluminosiloxane oil to be stirred at room temperature (20° C.) for 10 minutes. After the stirring, the obtained mixture was subjected to a defoaming process under reduced pressure with a vacuum dryer at room temperature for 30 minutes or more.

In this way, an encapsulating resin composition B was prepared (a filler content of 10 mass %).

Prepared Example 4

20 g of a filler D (silicone resin microparticles (polymethylsilsesquioxane microparticles), trade name: Tospearl 2000B, manufactured by Momentive Performance Materials Inc., an average particle size of 6.0 μm) was added to 80 g of the above-described mixture (oil) in Prepared Example 2 to be stirred at room temperature (20° C.) for 10 minutes. After the stirring, the obtained mixture was subjected to a defoaming process under reduced pressure with a vacuum dryer at room temperature for 30 minutes or more.

In this way, an encapsulating resin composition C was prepared (a filler content of 20 mass %).

Prepared Example 5

30 g of a filler D (silicone resin microparticles (polymethylsilsesquioxane microparticles), trade name: Tospearl 2000B, manufactured by Momentive Performance Materials Inc., an average particle size of 6.0 μm) was added to 70 g of the above-described mixture (oil) in Prepared Example 2 to be stirred at room temperature (20° C.) for 10 minutes. After the stirring, the obtained mixture was subjected to a defoaming process under reduced pressure with a vacuum dryer at room temperature for 30 minutes or more.

In this way, an encapsulating resin composition D was prepared (a filler content of 30 mass %).

Prepared Example 6

50 g of a filler D (silicone resin microparticles (polymethylsilsesquioxane microparticles), trade name: Tospearl 2000B, manufactured by Momentive Performance Materials Inc., an average particle size of 6.0 μm) was added to 50 g of the above-described mixture (oil) in Prepared Example 2 to be stirred at room temperature (20° C.) for 10 minutes. After the stirring, the obtained mixture was subjected to a defoaming process under reduced pressure with a vacuum dryer at room temperature for 30 minutes or more.

In this way, an encapsulating resin composition E was prepared (a filler content of 50 mass %).

Prepared Example 7

An encapsulating resin composition F (a filler content of 20 mass %) was prepared in the same manner as in Prepared Example 4, except that 20 g of a filler E (silicone resin microparticles (polymethylsilsesquioxane microparticles), trade name: Tospearl 145, manufactured by Momentive Performance Materials Inc., an average particle size of 4.5 μm) was used instead of 20 g of the filler D.

Prepared Example 8

An encapsulating resin composition G (a filler content of 20 mass %) was prepared in the same manner as in Prepared Example 4, except that 20 g of a filler F (silicone resin microparticles (polymethylsilsesquioxane microparticles), trade name: Silicone Powder KMP590, manufactured by Shin-Etsu Chemical Co., Ltd., an average particle size of 2.0 μm) was used instead of 20 g of the filler D.

Prepared Example 9

An encapsulating resin composition H (a filler content of 20 mass %) was prepared in the same manner as in Prepared Example 4, except that 20 g of a filler G (silicone resin microparticles (polymethylsilsesquioxane microparticles), trade name: Silicone Powder MSP-N050, manufactured by NIKKO RICA CORPORATION, an average particle size of 0.5 μm) was used instead of 20 g of the filler D.

Prepared Example 10

An encapsulating resin composition I (a filler content of 20 mass %) was prepared in the same manner as in Prepared Example 4, except that 20 g of a filler H (silicone resin microparticles (polymethylsilsesquioxane microparticles), trade name: Silicone Powder MSP-N080, manufactured by NIKKO RICA CORPORATION, an average particle size of 0.8 μm) was used instead of 20 g of the filler D.

Prepared Example 11

An encapsulating resin composition J (a filler content of 0 mass %) was prepared in the same manner as in Prepared Example 2, except that the filler was not added to the above-described mixture (oil) in Prepared Example 2.

Preparation of Light Transmissive Resin Composition

Prepared Example 12

Preparation of Light Transmissive Resin Composition "a"

A liquid and B liquid of an addition reaction curable type silicone resin composition (trade name: KER-2500, manufactured by Shin-Etsu Chemical Co., Ltd., a dimethylsiloxane derivative) were mixed at a ratio of 1/1 to prepare a liquid mixture.

Next, 10 g of a filler A (silicon dioxide, trade name: FB-3SDC, manufactured by DENKI KAGAKU KOGYO KABUSHIKI KAISHA., an average particle size of 3.4 μm) was added to 90 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "a" was prepared (a filler content of 10 mass %).

Prepared Example 13

Preparation of Light Transmissive Resin Composition "b"

A liquid and B liquid of an addition reaction curable type silicone resin composition (trade name: KER-2500, manufactured by Shin-Etsu Chemical Co., Ltd., a dimethylsiloxane derivative) were mixed at a ratio of 1/1 to prepare a liquid mixture.

Next, 10 g of a filler A (silicon dioxide, trade name: FB-3SDC, manufactured by DENKI KAGAKU KOGYO KABUSHIKI KAISHA., an average particle size of 3.4 μm) and 5 g of a filler B (silicon dioxide, trade name: AEROSIL R976S, manufactured by Nippon Aerosil Co., Ltd., an average particle size of 7 nm) were added to 90 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "b" was prepared (a filler content of 14.2 mass %).

Prepared Example 14

Preparation of Light Transmissive Resin Composition "c"

A liquid and B liquid of an addition reaction curable type silicone resin composition (trade name: KER-2500, manufactured by Shin-Etsu Chemical Co., Ltd., a dimethylsiloxane derivative) were mixed at a ratio of 1/1 to prepare a liquid mixture.

Next, 50 g of a filler C (silicon dioxide, trade name: FB-40S, manufactured by DENKI KAGAKU KOGYO KABUSHIKI KAISHA., an average particle size of 40 μm) was added to 50 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "c" was prepared (a filler content of 50 mass %).

Prepared Example 15

Preparation of Light Transmissive Resin Composition "d"

A liquid and B liquid of an addition reaction curable type silicone resin composition (trade name: KER-2500, manufactured by Shin-Etsu Chemical Co., Ltd., a dimethylsiloxane derivative) were mixed at a ratio of 1/1 to prepare a liquid mixture.

Next, 5 g of a filler B (silicon dioxide, trade name: AEROSIL R976S, manufactured by Nippon Aerosil Co., Ltd., an average particle size of 7 nm) and 100 g of a filler C (silicon dioxide, trade name: FB-40S, manufactured by DENKI KAGAKU KOGYO KABUSHIKI KAISHA., an average particle size of 40 µm) were added to 100 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "d" was prepared (a filler content of 51.2 mass %).

Prepared Example 16

Preparation of Light Transmissive Resin Composition "e"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 10 g of a filler A (silicon dioxide, trade name: FB-3SDC, manufactured by DENKI KAGAKU KOGYO KABUSHIKI KAISHA., an average particle size of 3.4 µm) was added to 90 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "e" was prepared (a filler content of 10 mass %).

Prepared Example 17

Preparation of Light Transmissive Resin Composition "f"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 10 g of a filler A (silicon dioxide, manufactured by DENKI KAGAKU KOGYO KABUSHIKI KAISHA., trade name: FB-3SDC, an average particle size of 3.4 µm) and 5 g of a filler B (silicon dioxide, manufactured by Nippon Aerosil Co., Ltd., trade name: AEROSIL R976S, an average particle size of 7 nm) were added to 90 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "f" was prepared (a filler content of 14.2 mass %).

Prepared Example 18

Preparation of Light Transmissive Resin Composition "g"

30.0 g of a colloidal silica (trade name: Snowtex OS, manufactured by NISSAN CHEMICAL INDUSTRIES, LTD., a solid content concentration of 20 mass %, an average particle size of 8 to 10 nm), 30.0 g of 2-propanol, and 6.0 g of 2-methoxyethanol were added into a reaction vessel provided with a reflux apparatus and a dropping funnel. Next, concentrated nitric acid was added thereto and the pH was adjusted in the range of 2.5 to 3.3. The temperature of the reaction vessel was increased to 70° C. And, a polymethylsilsesquioxane solution in which 50.0 g of polymethylsilsesquioxane containing an alkoxysilyl group (trade name: X-40-9225, manufactured by Shin-Etsu Chemical Co., Ltd., a methoxysilyl group content of 24 mass %) was dissolved in 50 g of the 2-propanol was added dropwise into the reaction vessel over 1 hour using the dropping funnel. Next, a polymethylsiloxane solution in which 70 g of polymethylsiloxane containing an alkoxysilyl group (trade name: X-40-9246, manufactured by Shin-Etsu Chemical Co., Ltd., a methoxysilyl group content of 12 mass %) was dissolved in 70 g of the 2-propanol was added dropwise thereto over 1 hour using the dropping funnel. After the dropping, the obtained mixture was heated and stirred at 100° C. for 1 hour to be reacted. After the reaction was terminated, a low boiling component was distilled off under reduced pressure and then, 120 g of toluene was added thereto to be heated and stirred again at 100° C. for 1 hour. Subsequently, the resulting mixture was cooled to room temperature to distill off a toluene solvent. After the distillation, the obtained mixture was subjected to a defoaming process under reduced pressure with a vacuum dryer at room temperature for 30 minutes or more.

In this way, a light transmissive resin composition "g", which is a viscous liquid containing silica microparticles, was prepared.

Prepared Example 19

Preparation of Light Transmissive Resin Composition "h"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 20 g of a filler D (silicone resin microparticles (polymethylsilsesquioxane microparticles), trade name: Tospearl 2000B, manufactured by Momentive Performance Materials Inc., an average particle size of 6.0 µm) was added to 80 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "h" was prepared (a filler content of 20 mass %).

Prepared Example 20

Preparation of Light Transmissive Resin Composition "i"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 30 g of a filler D (silicone resin microparticles (polymethylsilsesquioxane microparticles), trade name: Tospearl 2000B, manufactured by Momentive Performance Materials Inc., an average particle size of 6.0 μm) was added to 70 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "i" was prepared (a filler content of 30 mass %).

Prepared Example 21

Preparation of Light Transmissive Resin Composition "j"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 50 g of a filler D (silicone resin microparticles (polymethylsilsesquioxane microparticles), trade name: Tospearl 2000B, manufactured by Momentive Performance Materials Inc., an average particle size of 6.0 μm) was added to 50 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "j" was prepared (a filler content of 50 mass %).

Prepared Example 22

Preparation of Light Transmissive Resin Composition "k"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 20 g of a filler E (silicone resin microparticles (polymethylsilsesquioxane microparticles), trade name: Tospearl 145, manufactured by Momentive Performance Materials Inc., an average particle size of 4.5 μm) was added to 80 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "k" was prepared (a filler content of 20 mass %).

Prepared Example 23

Preparation of Light Transmissive Resin Composition "l"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 20 g of a filler F (silicone resin microparticles (polymethylsilsesquioxane microparticles), trade name: Silicone Powder KMP590, manufactured by Shin-Etsu Chemical Co., Ltd., an average particle size of 2.0 μm) was added to 80 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "l" was prepared (a filler content of 20 mass %).

Prepared Example 24

Preparation of Light Transmissive Resin Composition "m"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 20 g of a filler G (silicone resin microparticles (polymethylsilsesquioxane microparticles), trade name: Silicone Powder MSP-N050, manufactured by NIKKO RICA CORPORATION, an average particle size of 0.5 μm) was added to 80 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "m" was prepared (a filler content of 20 mass %).

Prepared Example 25

Preparation of Light Transmissive Resin Composition "n"

A liquid and B liquid of an addition reaction curable type silicone resin composition (trade name: LR-7665, manufactured by WACKER ASAHIKASEI SILICONE CO., LTD., a dimethylsiloxane derivative) were mixed at a ratio of 1/1 to prepare a liquid mixture.

Next, 20 g of a filler H (silicone resin microparticles (polymethylsilsesquioxane microparticles), trade name: Silicone Powder MSP-N080, manufactured by NIKKO RICA CORPORATION, an average particle size of 0.8 μm) was added to 80 g of the liquid mixture to be stirred at room temperature (20° C.) for 10 minutes. After the stirring, the obtained mixture was subjected to a defoaming process under reduced pressure with a vacuum dryer at room temperature for 30 minutes or more.

In this way, a light transmissive resin composition "n" was prepared (a filler content of 20 mass %).

Example 1

The resin composition containing a phosphor in Prepared Example 1 was applied onto the upper surface of a release sheet (ref: FIG. 2 (a)) formed of a polyester film (trade name: SS4C, manufactured by Nippa CO., LTD., a thickness of 50 μm) with a thickness of 100 μm to be dried at 100° C. for 10 minutes, so that a phosphor layer was formed on the release sheet (ref: FIG. 2 (b)).

Next, the light transmissive resin composition "a" in Prepared Example 12 was applied onto the upper surface of the phosphor layer with a thickness of 500 μm to be dried at 150° C. for 10 minutes, so that a barrier layer was formed on the phosphor layer (ref: FIG. 2 (c)).

The elastic modulus of the barrier layer was 8.2 MPa.

The elastic modulus was measured with a tensile testing machine (manufactured by Shimazu Corporation, Autograph AGS-J).

Next, the encapsulating resin composition A in Prepared Example 2 was applied onto the upper surface of the barrier layer with a thickness of 500 μm to be dried at 105° C. for 9 minutes. In this way, the encapsulating resin composition A was brought into a semi-cured state, so that an encapsulating resin layer was formed on the barrier layer (ref: FIG. 2 (d)).

As described above, an encapsulating sheet was prepared.

Next, the encapsulating sheet was disposed with respect to a board mounted with the light emitting diode such that the encapsulating resin layer was opposed to a light emitting diode (ref: FIG. 3 (a)). Then, the encapsulating sheet was pressed with a metal flat plate under pressing conditions of a temperature of 160° C., a duration of 5 minutes, and a pressure of 0.1 MPa, so that the encapsulating sheet was compressively bonded to the light emitting diode and the board (ref: FIG. 3 (b)).

In this way, the encapsulating resin layer was cured to form an encapsulating layer, so that the light emitting diode was encapsulated. Next, a release sheet was peeled off (ref: FIG. 3 (c)).

As described above, an LED device was fabricated.

Example 2

An encapsulating sheet and an LED device were fabricated in the same manner as in Example 1, except that the light transmissive resin composition "b" in Prepared Example 13 was used instead of the light transmissive resin composition "a" in Prepared Example 12.

The elastic modulus of the barrier layer was 10.7 MPa.

Example 3

An encapsulating sheet and an LED device were fabricated in the same manner as in Example 1, except that the light transmissive resin composition "c" in Prepared Example 14 was used instead of the light transmissive resin composition "a" in Prepared Example 12.

The elastic modulus of the barrier layer was 8.8 MPa.

Example 4

An encapsulating sheet and an LED device were fabricated in the same manner as in Example 1, except that the light transmissive resin composition "d" in Prepared Example 15 was used instead of the light transmissive resin composition "a" in Prepared Example 12.

The elastic modulus of the barrier layer was 15 MPa.

Example 5

An encapsulating sheet and an LED device were fabricated in the same manner as in Example 1, except that the light transmissive resin composition "e" in Prepared Example 16 was used instead of the light transmissive resin composition "a" in Prepared Example 12.

The elastic modulus of the barrier layer was 2.5 MPa.

Example 6

An encapsulating sheet and an LED device were fabricated in the same manner as in Example 1, except that the translucent resin composition "f" in Prepared Example 17 was used instead of the translucent resin composition "a" in Prepared Example 12.

The elastic modulus of the barrier layer was 3.7 MPa.

Example 7

An encapsulating sheet and an LED device were fabricated in the same manner as in Example 1, except that the light transmissive resin composition "a" in Prepared Example 12 was applied onto the upper surface of the phosphor layer with a thickness of 300 μm and the encapsulating resin composition A in Prepared Example 2 was applied onto the upper surface of the barrier layer with a thickness of 700 μm.

The elastic modulus of the barrier layer was 8.2 MPa.

Example 8

An encapsulating sheet and an LED device were fabricated in the same manner as in Example 1, except that the encapsulating resin composition A in Prepared Example 2 was applied onto the upper surface of the barrier layer with a thickness of 1000 μm.

The elastic modulus of the barrier layer was 8.2 MPa.

Example 9

An encapsulating sheet and an LED device were fabricated in the same manner as in Example 1, except that the light transmissive resin composition "a" in Prepared Example 12 was applied onto the upper surface of the phosphor layer with a thickness of 1000 μm.

The elastic modulus of the barrier layer was 8.2 MPa.

Example 10

The resin composition containing a phosphor in Prepared Example 1 was applied onto the upper surface of a release sheet formed of a polyester film (trade name: SS4C, manufactured by Nippa CO., LTD., a thickness of 50 μm) with a thickness of 100 μm to be dried at 100° C. for 10 minutes, so that a phosphor layer was formed on the release sheet.

Separately, the light transmissive resin composition "g" in Prepared Example 18 was applied onto the upper surface of a release sheet formed of the polyester film (trade name: SS4C, manufactured by Nippa CO., LTD., a thickness of 50 μm) with a thickness of 200 μm to be dried at 100° C. for 30 minutes and furthermore, dried at 200° C. for 1 hour, so that a barrier layer was formed on the release sheet. The elastic modulus of the barrier layer was 146 MPa.

Next, A liquid and B liquid of an addition reaction curable type silicone resin composition (manufactured by Shin-Etsu Chemical Co., Ltd., trade name: KER-2500, a dimethylsiloxane derivative) were mixed at a ratio of 1/1 to prepare a liquid mixture. The liquid mixture was applied on the phosphor layer such that the thickness thereof is 10 μm or less and the barrier layer peeled off from the release sheet was attached thereon. Next, the obtained layers were dried at 150° C. for 10 minutes, so that a wavelength conversion layer formed of the phosphor layer and the barrier layer was obtained.

Next, the encapsulating resin composition A in Prepared Example 2 was applied onto the barrier layer of the wavelength conversion layer with a thickness of 800 μm to be dried at 105° C. for 9 minutes. In this way, the encapsulating resin composition A was brought into a semi-cured state, so that an encapsulating sheet was fabricated.

Next, an LED device was fabricated in the same manner as in Example 1.

Example 11

An encapsulating sheet and an LED device were fabricated in the same manner as in Example 10, except that the resin composition containing a phosphor in Prepared Example 1 was applied onto the upper surface of the release sheet with a thickness of 300 μm and the light transmissive resin composition "g" in Prepared Example 18 was applied onto the upper surface of the release sheet with a thickness of 700 μm.

The elastic modulus of the encapsulating sheet was 146 MPa.

Example 12

An encapsulating sheet and an LED device were fabricated in the same manner as in Example 1, except that the encapsulating resin composition B in Prepared Example 3 was applied onto the upper surface of the barrier layer with a thickness of 500 μm to be dried at 100° C. for 10 minutes instead of the encapsulating resin composition A in Prepared Example 2.

The elastic modulus of the barrier layer was 8.2 MPa.

Example 13

The light transmissive resin composition "b" in Prepared Example 13 was applied onto the upper surface of a release sheet (ref: FIG. 2 (a)) formed of a polyester film (trade name: SS4C, manufactured by Nippa CO., LTD., a thickness of 50 μm) with a thickness of 500 μm to be dried at 150° C. for 10 minutes, so that a barrier layer was formed on the release sheet. The elastic modulus of the barrier layer was 8.2 MPa.

Next, the resin composition containing a phosphor in Prepared Example 1 was applied onto the upper surface of the barrier layer with a thickness of 100 μm to be dried at 100° C. for 10 minutes, so that a phosphor layer was formed on the barrier layer.

Next, the encapsulating resin composition A in Prepared Example 2 was applied onto the upper surface of the phosphor layer with a thickness of 1000 μm to be dried at 105° C. for 9 minutes. In this way, the encapsulating resin composition A was brought into a semi-cured state, so that an encapsulating resin layer was formed on the barrier layer.

As described above, an encapsulating sheet was prepared (ref: FIG. 5).

Next, an LED device was fabricated in the same manner as in Example 1.

Example 14

An encapsulating sheet and an LED device were fabricated in the same manner as in Example 1, except that the light transmissive resin composition "h" in Prepared Example 19 was used instead of the light transmissive resin composition "a" in Prepared Example 12 and the encapsulating resin composition C in Prepared Example 4 was used instead of the encapsulating resin composition A in Prepared Example 2.

The elastic modulus of the barrier layer was 6.3 MPa.

Example 15

An encapsulating sheet and an LED device were fabricated in the same manner as in Example 1, except that the light transmissive resin composition "i" in Prepared Example 20 was used instead of the light transmissive resin composition "a" in Prepared Example 12 and the encapsulating resin composition D in Prepared Example 5 was used instead of the encapsulating resin composition A in Prepared Example 2.

The elastic modulus of the barrier layer was 6.5 MPa.

Example 16

An encapsulating sheet and an LED device were fabricated in the same manner as in Example 1, except that the light transmissive resin composition "j" in Prepared Example 21 was used instead of the light transmissive resin composition "a" in Prepared Example 12 and the encapsulating resin composition E in Prepared Example 6 was used instead of the encapsulating resin composition A in Prepared Example 2.

The elastic modulus of the barrier layer was 15.9 MPa.

Example 17

An encapsulating sheet and an LED device were fabricated in the same manner as in Example 1, except that the light transmissive resin composition "k" in Prepared Example 22 was used instead of the light transmissive resin composition "a" in Prepared Example 12 and the encapsulating resin composition F in Prepared Example 7 was used instead of the encapsulating resin composition A in Prepared Example 2.

The elastic modulus of the barrier layer was 5.9 MPa.

Example 18

An encapsulating sheet and an LED device were fabricated in the same manner as in Example 1, except that the light transmissive resin composition "l" in Prepared Example 23 was used instead of the light transmissive resin composition "a" in Prepared Example 12 and the encapsulating resin composition G in Prepared Example 8 was used instead of the encapsulating resin composition A in Prepared Example 2.

The elastic modulus of the barrier layer was 8.3 MPa.

Example 19

An encapsulating sheet and an LED device were fabricated in the same manner as in Example 1, except that the light transmissive resin composition "m" in Prepared Example 24 was used instead of the light transmissive resin composition "a" in Prepared Example 12 and the encapsulating resin composition H in Prepared Example 9 was used instead of the encapsulating resin composition A in Prepared Example 2.

The elastic modulus of the barrier layer was 4.5 MPa.

Example 20

An encapsulating sheet and an LED device were fabricated in the same manner as in Example 1, except that the light transmissive resin composition "n" in Prepared Example 25 was used instead of the light transmissive resin composition "a" in Prepared Example 12 and the encapsulating resin composition I in Prepared Example 10 was used instead of the encapsulating resin composition A in Prepared Example 2.

The elastic modulus of the barrier layer was 4.6 MPa.

Comparative Example 1

An encapsulating sheet and an LED device were fabricated in the same manner as in Example 1, except that the barrier layer was not provided and the encapsulating resin composition A in Prepared Example 2 was applied onto the upper surface of the phosphor layer with a thickness of 1000 μm. That is, the encapsulating sheet in Comparative Example 1 is formed of only the encapsulating resin layer and the phosphor layer laminated on the encapsulating resin layer.

Comparative Example 2

An encapsulating sheet and an LED device were fabricated in the same manner as in Example 1, except that the light transmissive resin composition "a" in Prepared Example 12 was applied onto the upper surface of the phosphor layer with a thickness of 100 μm and the encapsulating resin composition A in Prepared Example 2 was applied onto the upper surface of the barrier layer with a thickness of 900 μm.

The elastic modulus of the barrier layer was 8.2 MPa.

Comparative Example 3

An encapsulating sheet and an LED device were fabricated in the same manner as in Example 1, except that the light transmissive resin composition "e" in Prepared Example 16 was applied onto the upper surface of the phosphor layer with a thickness of 100 μm instead of the light transmissive resin composition "a" in Prepared Example 12 and the encapsulating resin composition A in Prepared Example 2 was applied onto the upper surface of the barrier layer with a thickness of 900 μm.

The elastic modulus of the barrier layer was 2.5 MPa.

Comparative Example 4

An encapsulating sheet and an LED device were fabricated in the same manner as in Comparative Example 1, except that the encapsulating resin composition J in Prepared Example 11 was used instead of the encapsulating resin composition A in Prepared Example 2.

(Evaluation)

1. Precipitation Test (Bleeding Test) and Shape Change Test of Liquid Resin

In each of the LED devices in Examples and Comparative Examples, an electric current of 250 mA was applied through the light emitting diode, so that the light emitting diode was allowed to continuously light up in a constant temperature and humidity chamber set to be at 85° C. and a relative humidity (RH) of 85%. Then, the tests below were performed.

1) Precipitation Test (Bleeding Test) of Liquid Resin

The evaluation was conducted as follows: when the bleeding of the liquid resin was not confirmed on the surface of the LED device 24 hours after the start of the continuous lighting up visually and with a light microscope, the LED device was evaluated as "Good" and when the bleeding of the liquid resin was confirmed thereon, the LED device was evaluated as "Bad". The results are shown in Table 1.

2) Shape Change Test

The evaluation was conducted as follows: when the change of the shape was not confirmed on the surface of the LED device 24 hours after the start of the continuous lighting up visually, the LED device was evaluated as "Good" and when the change of the shape was confirmed thereon, the LED device was evaluated as "Bad". The results are shown in Table 1.

2. Brightness Test

The initial brightness of the total luminous flux in each of the LED devices in Examples and Comparative Examples was measured by applying an electric current of 250 mA through the light emitting diode with a brightness measurement device (manufactured by OTSUKA ELECTRONICS CO., LTD., MCPD 9800) and an integrating sphere (manufactured by OTSUKA ELECTRONICS CO., LTD., Half-Moon).

The brightness loss (%) of each of the LED devices in Examples and Comparative Examples was calculated by defining the brightness of the LED device in Comparative Example 4 as the reference brightness (0% of the brightness loss). The results are shown in Table 1.

TABLE 1

| | Barrier Layer | | | Encapsulating Resin Layer | | Pres. or Abs. of Bleeding | Pres. or Abs. of Shape Change | Brightness Loss (%) |
|---|---|---|---|---|---|---|---|---|
| | Light Transmissive Resin Comp. | Thickness (μm) | Elastic Modulus (MPa) | Encapsulating Resin Comp. | Thickness (μm) | | | |
| Ex. 1 | a | 500 | 8.2 | A | 500 | Good | Good | 2 |
| Ex. 2 | b | 500 | 10.7 | A | 500 | Good | Good | 2 |
| Ex. 3 | c | 500 | 8.8 | A | 500 | Good | Good | 9 |
| Ex. 4 | d | 500 | 15 | A | 500 | Good | Good | 9 |
| Ex. 5 | e | 500 | 2.5 | A | 500 | Good | Good | 2 |
| Ex. 6 | f | 500 | 3.7 | A | 500 | Good | Good | 2 |
| Ex. 7 | a | 300 | 8.2 | A | 700 | Good | Good | 2 |
| Ex. 8 | a | 500 | 8.2 | A | 1000 | Good | Good | 2 |
| Ex. 9 | a | 1000 | 8.2 | A | 500 | Good | Good | 2 |
| Ex. 10 | g | 200 | 146 | A | 800 | Good | Good | 2 |
| Ex. 11 | g | 300 | 146 | A | 700 | Good | Good | 2 |
| Ex. 12 | a | 500 | 8.2 | B | 500 | Good | Good | 2 |

TABLE 1-continued

Table 1

|  | Barrier Layer | | | Encapsulating Resin Layer | | Pres. or Abs. of Bleeding | Pres. or Abs. of Shape Change | Brightness Loss (%) |
| --- | --- | --- | --- | --- | --- | --- | --- | --- |
|  | Light Transmissive Resin Comp. | Thickness (μm) | Elastic Modulus (MPa) | Encapsulating Resin Comp. | Thickness (μm) | | | |
| Ex. 13 | a | 500 | 8.2 | A | 1000 | Good | Good | 2 |
| Ex. 14 | h | 500 | 6.3 | C | 500 | Good | Good | 0 |
| Ex. 15 | i | 500 | 6.5 | D | 500 | Good | Good | 0 |
| Ex. 16 | j | 500 | 15.9 | E | 500 | Good | Good | 0 |
| Ex. 17 | k | 500 | 5.9 | F | 500 | Good | Good | 0 |
| Ex. 18 | l | 500 | 8.3 | G | 500 | Good | Good | 0 |
| Ex. 19 | m | 500 | 4.5 | H | 500 | Good | Good | 0 |
| Ex. 20 | n | 500 | 4.6 | I | 500 | Good | Good | 0 |
| Comp. Ex. 1 | — | — | — | A | 1000 | Bad | Bad | 2 |
| Comp. Ex. 2 | a | 100 | 8.2 | A | 900 | Bad | Bad | 2 |
| Comp. Ex. 3 | e | 100 | 2.5 | A | 900 | Bad | Bad | 2 |
| Comp. Ex. 4 | — | — | — | J | 1000 | Bad | Bad | 0 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. An encapsulating sheet comprising:
an encapsulating resin layer and
a wavelength conversion layer laminated on the encapsulating resin layer, wherein
the wavelength conversion layer is formed by laminating
a barrier layer formed of a light transmissive resin composition and having a thickness of 200 μm to 1000 μm, and
a phosphor layer containing a phosphor.

2. The encapsulating sheet according to claim 1, wherein the light transmissive resin composition contains a silicone resin.

3. The encapsulating sheet according to claim 1, wherein the elastic modulus of the barrier layer is 3 MPa to 500 MPa.

4. The encapsulating sheet according to claim 1, wherein the barrier layer is laminated on the encapsulating resin layer.

5. The encapsulating sheet according to claim 1, wherein the phosphor layer is laminated on the encapsulating resin layer.

6. An optical semiconductor element device comprising:
an optical semiconductor element and
an encapsulating layer that is formed of an encapsulating sheet and encapsulates the optical semiconductor element, wherein
the encapsulating sheet comprising:
an encapsulating resin layer and
a wavelength conversion layer laminated on the encapsulating resin layer, wherein
the wavelength conversion layer is formed by laminating
a barrier layer formed of a light transmissive resin composition and having a thickness of 200 μm to 1000 μm, and
a phosphor layer containing a phosphor.

* * * * *